(12) United States Patent
Liu et al.

(10) Patent No.: US 9,098,390 B2
(45) Date of Patent: Aug. 4, 2015

(54) APPARATUS AND METHOD FOR A NETWORKED POWER MANAGEMENT SYSTEM WITH ONE-CLICK REMOTE BATTERY DISCHARGE TESTING

(71) Applicants: Guang Liu, Lake Zurich, IL (US); Joseph M. Holland, Woburn, MA (US); Larry L. Ye, Lake Forest, IL (US); John F. Olliver, Lawrenceville, GA (US)

(72) Inventors: Guang Liu, Lake Zurich, IL (US); Joseph M. Holland, Woburn, MA (US); Larry L. Ye, Lake Forest, IL (US); John F. Olliver, Lawrenceville, GA (US)

(73) Assignee: LifeSafety Power, Inc., Mundelein, IL (US)

( * ) Notice: Subject to any disclaimer, the term of this patent is extended or adjusted under 35 U.S.C. 154(b) by 25 days.

(21) Appl. No.: 13/859,579

(22) Filed: Apr. 9, 2013

(65) Prior Publication Data

US 2013/0275783 A1    Oct. 17, 2013

Related U.S. Application Data

(63) Continuation-in-part of application No. 12/946,287, filed on Nov. 15, 2010, now Pat. No. 8,566,651.

(51) Int. Cl.
| | |
|---|---|
| *G06F 11/00* | (2006.01) |
| *G01R 31/36* | (2006.01) |
| *H02J 7/00* | (2006.01) |
| *G06F 1/26* | (2006.01) |
| *G06F 11/22* | (2006.01) |

(Continued)

(52) U.S. Cl.
CPC .......... *G06F 11/00* (2013.01); *G01R 31/3606* (2013.01); *G06F 1/263* (2013.01); *G06F 1/30* (2013.01); *G06F 11/2294* (2013.01); *H02J 7/0047* (2013.01); *H02J 7/0063* (2013.01); *H02J 9/06* (2013.01)

(58) Field of Classification Search
CPC .............. G01R 31/36; G01R 31/3606; G01R 31/3627; G01R 31/3631; G01R 31/3634; G01R 31/3637; G01R 31/3644; G01R 31/3689; G06F 11/00
USPC .................... 714/1, 25; 702/63; 324/426, 429
See application file for complete search history.

(56) References Cited

U.S. PATENT DOCUMENTS

| | | | |
|---|---|---|---|
| 4,972,181 A * | 11/1990 | Fiene | 340/636.16 |
| 5,646,509 A * | 7/1997 | Berglund et al. | 713/321 |

(Continued)

OTHER PUBLICATIONS

Simplex Brochure, Life Alarm Fire Alarm Controls, S4009-001-9, (Aug. 1999).

(Continued)

*Primary Examiner* — Joseph Kudirka
(74) *Attorney, Agent, or Firm* — Cygan Law Offices P.C.; Joseph T. Cygan

(57) ABSTRACT

A method of operation includes receiving, by a power supply with battery backup, a battery test command from a user interface on a remote device, switching the power supply to the battery backup in response to the battery test command, monitoring voltage and discharge current of the battery, determining that the battery has reached a threshold capacity due the battery discharge, terminating the battery discharge test and switching the power supply off of the battery backup. The battery backup test command received may be a one-click selection input at a user interface on the remote device where the battery test command is sent to the power supply in response to the one-click selection input. An apparatus that performs the method of operation is also disclosed.

20 Claims, 18 Drawing Sheets

(51) Int. Cl.
*G06F 1/30* (2006.01)
*H02J 9/06* (2006.01)

(56) References Cited

U.S. PATENT DOCUMENTS

| | | | |
|---|---|---|---|
| 5,675,816 A * | 10/1997 | Hiyoshi et al. | 713/324 |
| 5,726,573 A * | 3/1998 | Chen et al. | 324/429 |
| 5,886,503 A * | 3/1999 | McAndrews et al. | 320/121 |
| 5,929,781 A * | 7/1999 | Vosika | 340/12.22 |
| 5,995,946 A | 11/1999 | Auzenne et al. | |
| 6,031,354 A * | 2/2000 | Wiley et al. | 320/116 |
| 6,366,211 B1 | 4/2002 | Parker | |
| 6,437,574 B1 * | 8/2002 | Robinson et al. | 324/426 |
| 6,946,972 B2 | 9/2005 | Mueller et al. | |
| 7,184,905 B2 | 2/2007 | Stefan | |
| 7,274,305 B1 | 9/2007 | Luttrell | |
| 7,391,315 B2 | 6/2008 | Friar | |
| 7,446,654 B2 | 11/2008 | Addy | |
| 7,447,117 B2 | 11/2008 | Yang | |
| 7,706,928 B1 | 4/2010 | Howell et al. | |
| 7,711,814 B1 | 5/2010 | Emerick et al. | |
| 7,719,415 B2 | 5/2010 | Dahl et al. | |
| 7,999,666 B2 * | 8/2011 | Barrieau et al. | 340/506 |
| 2003/0028827 A1 | 2/2003 | Gray | |
| 2005/0149280 A1 * | 7/2005 | Sharma et al. | 702/63 |
| 2007/0085676 A1 | 4/2007 | Lee et al. | |
| 2009/0089140 A1 | 4/2009 | Miyamoto | |
| 2009/0195211 A1 * | 8/2009 | Wang et al. | 320/136 |
| 2010/0204960 A1 | 8/2010 | Hagadone et al. | |
| 2011/0273180 A1 * | 11/2011 | Park et al. | 324/427 |

OTHER PUBLICATIONS

Honeywell Brochure, Remote Booster Power Supplies, Specification Data, 74-3300-1 (2002).

GE Security, FireworX Fire & Life Safety Power Supplies, Data Sheet FX85005-0125, Issue 2, (2009).

Security Door Controls (SDC) 632RF 2 Amp Power Supply (Jul. 2008).

* cited by examiner

- PRIOR ART -

- PRIOR ART -

1400

| | | Parameter |
|---|---|---|
| Site ID | | |
| Main building | ✓ | Cabinet internal temperature |
| | ✓ | Hall current sensor 1 |
| | ✓ | Hall current sensor 2 |
| | ✓ | Hall current sensor 3 |
| | ✓ | ADC voltage 1 |
| | ✓ | ADC voltage 2 |
| | ✓ | ADC voltage 3 |
| | ✓ | Event 1 status |
| | ✓ | Event 2 status |
| | ✓ | PWM output 1 |
| | ✓ | PWM output 2 |
| | ✓ | Logic output 1 |
| | ✓ | Logic output 2 |

1401 — Site ID
1402 — Parameter
1403 — ☐ Check/uncheck ALL

FIG. 14

| MCU signal | Assigned name |
|---|---|
| Site ID | Main building |
| Hall Sensor 1 | Battery Current |
| Hall Sensor 2 | FP1 output current |
| Hall Sensor 3 | FP2 output current |
| ADC1 reading | Battery voltage |
| ADC2 reading | NAC1 output1 voltage |
| ADC3 reading | NAC1 output2 voltage |
| Event1 | Front door alarm |
| Event2 | Back door alarm |
| PWM1 | PWM1 |
| PWM2 | PWM2 |
| Logic_OUT1 | Camera1 enable |
| Logic_OUT2 | Camera2 enable |

| PWM Ch. | Frequency | Duty (%) |
|---|---|---|
| PWM1 | 20 kHz | 50 |
| PWM2 | 120 Hz | 100 |

1751 / 1752 / 1753 / 1700

| Logic Output | Set Value |
|---|---|
| Output 1 | Low |
| Output 2 | High |

| Select | Warning Type | Battery Parameter | Value | Unit |
|---|---|---|---|---|
| ☑ | End of Life warning | Rated battery life | 4 | Years |
| ☑ | Battery low warning | Rated Amp-Hour | 36 | A-H |

APPARATUS AND METHOD FOR A NETWORKED POWER MANAGEMENT SYSTEM WITH ONE-CLICK REMOTE BATTERY DISCHARGE TESTING

CROSS-REFERENCE TO RELATED APPLICATIONS

The present disclosure is a Continuation-in-Part of co-pending U.S. patent application Ser. No. 12/946,287, entitled "APPARATUS AND METHOD FOR A NETWORKED POWER MANAGEMENT SYSTEM FOR SECURITY AND LIFE SAFETY APPLICATIONS," filed Nov. 15, 2010, which is assigned to the same assignee as the present application, and which is hereby incorporated by reference herein in its entirety.

FIELD OF THE DISCLOSURE

The present disclosure relates generally to power supply systems for security and life safety equipment (access control, security surveillance camera, fire and burglary alarm systems, mass notification equipment, etc.) and more particularly to apparatuses and methods providing remotely accessible power supply systems.

BACKGROUND

Power supplies with battery backup and basic fault reporting means for security and life safety systems have been in existence for decades. These power supply systems provide some mechanism for basic fault detection and reporting as required by industry specifications. Most commonly, visual indicators and relay contacts are the primary means for fault notification. In these traditional power supply systems, power system control or parameter change necessitates direct physical change of the device by an on-site technician and cannot be done otherwise. Examples of existing power supply systems with this kind of fault notification are illustrated in FIG. 1 and FIG. 2.

FIG. 1 provides a simplified block diagram of an existing power supply system 100. In FIG. 1, a complete power supply/charger board 101 includes an isolated AC-DC power converter 102 which is a power supply that converts AC power into isolated 12V or 24V DC power outputs. The DC output from the isolated AC-DC converter 102 is sent to one or more output terminals under the control of control and fault detection circuitry 103. For example, DC is provided to three pairs of output terminals DC1, DC2 and DC3 as shown. DC1 is a normal constant-on output while the DC2 and DC3 outputs are controlled by a Fire Alarm Interface (FAI) signal (not shown). The DC2 output is on when the FAI signal is inactive and DC3 is on when the FAI signal is active. The control and fault detection circuitry 103 also detects faults in the system including loss of AC power (AC Fault), and system faults. The system faults include "output voltage out of range" and "battery not present." The control and fault detection circuitry 103 also handles the battery power transfer in event of an AC power outage. Charger 104 charges the battery 107 and maintains it at near full capacity when AC power is normal. The system fault relay 105 and AC fault relay 106 are normally energized, that is, energized when there is no fault condition present. When AC power is lost, the AC fault relay 106 is de-energized, causing a change in the contact state and either closing or opening its various provided output contacts. The output contacts can be used to signal some upper level control device to react to the fault condition. Similarly, when any one of the system faults occurs, the system fault relay 105 will change its contact states and thereby notify an upper control device of the fault condition. The LED indicators 108 are a group of LED indicators that are utilized to indicate the presence of AC input, DC output, specific fault conditions and FAI signal status. For example, one green LED may indicate AC power present, a second green LED may indicate DC1 output normal, a third green LED may indicate that either DC2 or DC3 has power, a red LED may indicate FAI activation, a yellow LED may indicate an AC Fault, a second yellow LED may indicate a system fault and a third yellow LED may indicate a reverse battery condition.

FIG. 2 provides a simplified block diagram of another existing power supply system 200. The functionality of the power supply system 200 is similar to the power supply system 100, except that the power supply system 200 does not have an FAI interface and does not provide the two FAI controlled DC outputs (DC2 and DC3). In FIG. 2, the FAI signal is input to a Notification Appliance Circuit (NAC) power control board 209. The power to the NAC power control board 209 is provided by the DC input DC1 from the main power supply board 201 as shown.

A drawback of the traditional existing power systems described above and exemplified in FIG. 1 and FIG. 2, is that service personnel must be on site to troubleshoot every fault condition, and to perform periodic maintenance. For example, nowadays a security company may manage thousands of security cameras spread out in many different buildings. Sometimes those cameras can get stuck and require the power to be cycled (i.e. reset the camera). The security company has to send technicians to the field to reset every camera that gets stuck.

Another problem with traditional existing power systems involves battery maintenance. To ensure the battery is functioning properly, a service technician must go to every job site to test the battery operation at a certain period of time.

Another drawback of these traditional existing power systems is that they do not provide system operating parameters and therefore it is difficult to detect potential failures before the failure happens.

BRIEF DESCRIPTION OF THE DRAWINGS

FIG. 14 is a diagram of an MCU parameter report setting page of the GUI in accordance with an embodiment.

FIG. 17 is a diagram of a PWM setting page and a logic output setting page of the GUI in accordance with an embodiment.

FIG. 18 is a diagram of a battery setting page of the GUI in accordance with an embodiment.

FIG. 21 is an example of a power supply/charger data page of the GUI in accordance with an embodiment.

DETAILED DESCRIPTION

Figure 1:
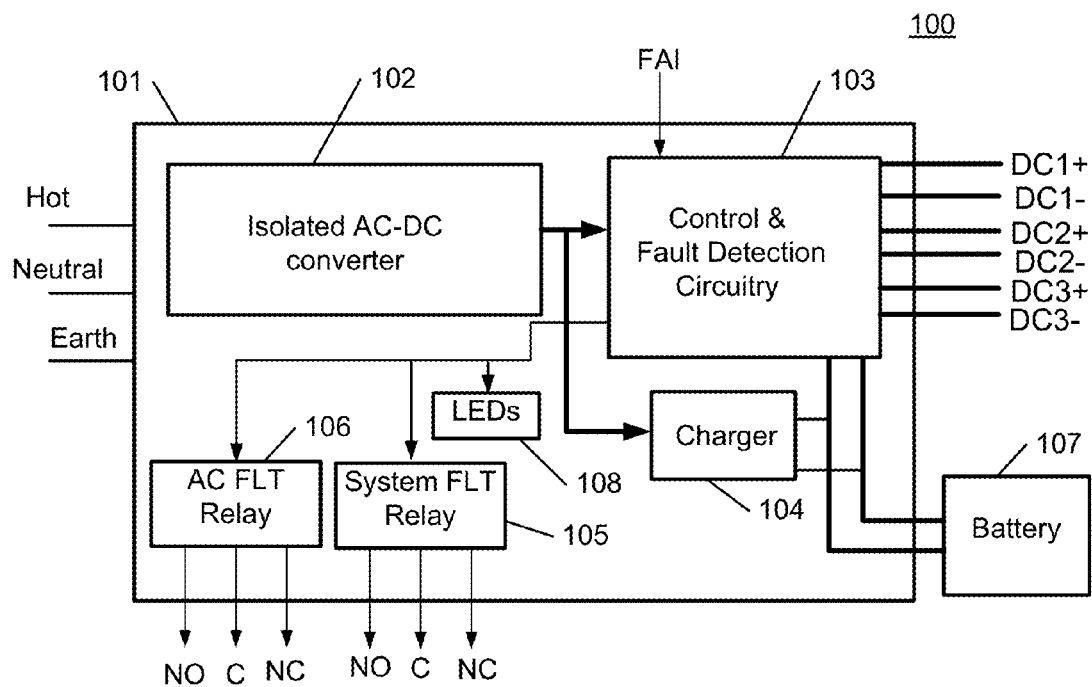
FIG. 1 is a block diagram providing an example of an existing power management system.
Figure 2:
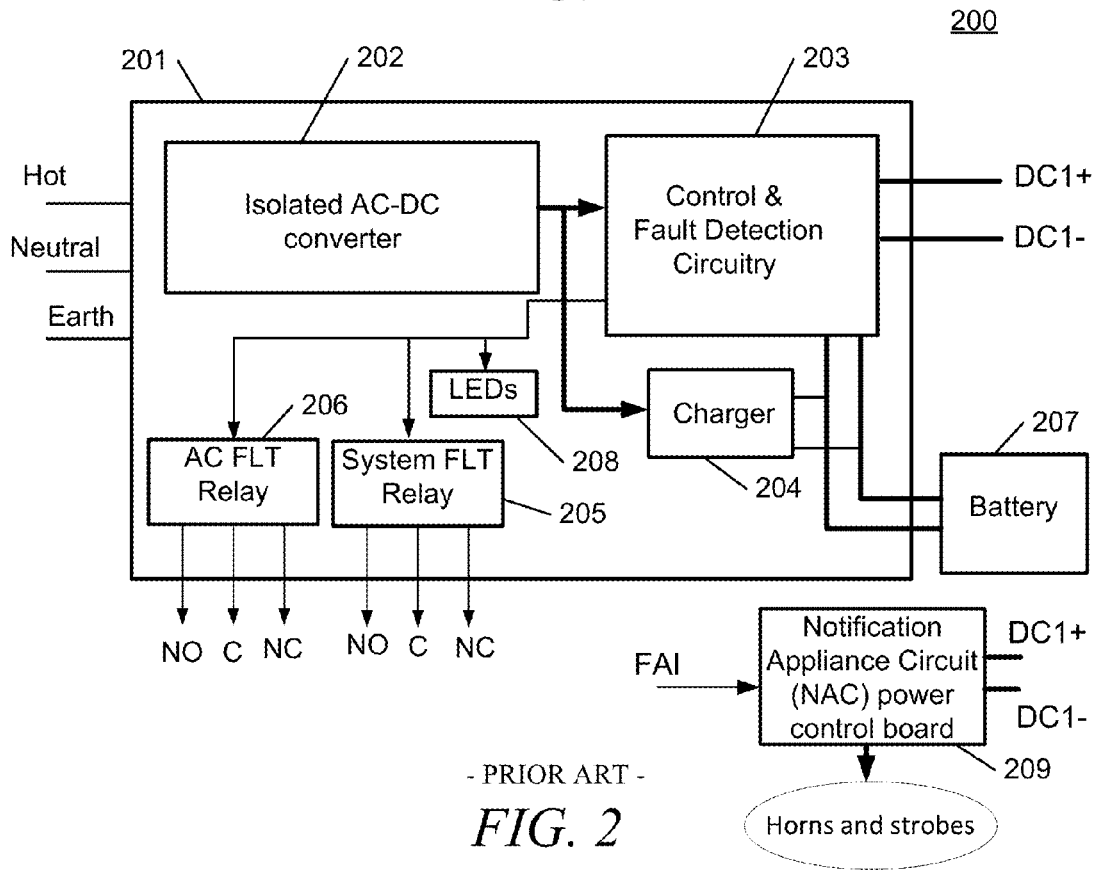
FIG. 2 is a block diagram providing another example of an existing power management system.

The disclosed embodiments provide methods and apparatuses for remote testing the condition of a battery in a networked power supply system. From a remote device, a user can initiate an immediate battery discharge test using a single cursor or mouse click (i.e. a one-click approach), or schedule an automatic battery discharge test for a later date. Upon completion of the test, the battery run time and test date are displayed on a user interface. Among other advantages, the disclosed remote battery discharge test methods and apparatuses provide early detection of premature battery failure and may also replace periodic on-site battery testing by technicians for some applications where testing is required by governmental or other regulations.

Accordingly, one disclosed method of operating a power management system, includes receiving, by a power supply with battery backup, a battery test command from a user interface on a remote device, switching the power supply to the battery backup in response to the battery test command to initiate a battery discharge test, monitoring voltage and discharge current of the battery, determining that the battery has reached a threshold capacity due to battery discharge, terminating the battery discharge test and switching the power supply off of the battery backup.

The method may include receiving a one-click selection input at a user interface on the remote device and sending the battery test command in response to the one-click selection input. The method may further include comparing the monitored voltage and discharge current of the battery with battery specification data, and determining that the battery has reached the threshold capacity based on the comparison.

Receiving a battery test command from a user interface on a remote device by the power supply with battery backup may include receiving the battery test command by control and access logic operatively coupled to the power supply, over a network connection. Switching the power supply to the battery backup in response to the battery test command may involve controlling at least one relay by the control and access logic to switch the power supply to the battery backup in response to the battery test command.

The method may include receiving the battery test command from data manager and interface logic over the network, forwarding the battery test command to the control and access logic at the power supply and providing measurement data to the remote device by the data manager and interface logic. The measurement data will include voltage and discharge current of the battery measured by the control and access logic and by the data manager and interface logic. The method may also include generating and emailing a battery test report conforming to a plurality of configurable report settings in response to termination of the battery discharge test.

A disclosed apparatus may include a power supply and battery charger board that has control and access logic operatively coupled to the power supply and the battery charger, where the control and access logic is operative to receive a battery test command from a user interface on a remote device, switch the power supply to battery backup in response to the battery test command to initiate a battery discharge test, monitor voltage and discharge current of the battery, determine that the battery has reached a threshold capacity due to battery discharge, terminate the battery discharge test, and switch the power supply off of the battery backup.

In some embodiment, the apparatus includes data manager and interface logic, operatively coupled to the control and access logic. The data manager and interface logic has a plurality of interface ports including at least one network interface port. The data manager and interface logic is operative to receive a one-click selection input from the user interface on the remote device over the network interface port, and send the battery test command to the control and access logic in response to the one-click selection input.

Either or both of the control and access logic or the data manager and interface logic may be operative to compare the monitored voltage and discharge current of the battery with battery specification data and determine that the battery has reached the threshold capacity based on the comparison.

The control and access logic is operative to switch the power supply to the battery backup in response to the battery test command, by controlling at least one relay to switch the power supply to the battery backup in response to the battery test command.

In some embodiments, the data manager and interface logic may be operative to generate the battery test command based on the one-click selection input and send the battery test command to the control and access logic at the power supply, and also provide measurement data to the remote device. The measurement data includes the voltage and discharge current of the battery measured by the control and access logic and by the data manager and interface logic. The data manager and interface logic may also generate and email a battery test report conforming to a plurality of configurable report settings in response to termination of the battery discharge test.

The embodiments also include a computer readable memory, which is a non-transitory, non-volatile memory that stores executable instructions for execution by at least one processor. The executable instructions, when executed, cause the at least one processor to receive a battery test command from a user interface on a remote device, switch a power supply to battery backup in response to the battery test command to initiate a battery discharge test, monitor voltage and discharge current of the battery, determine that the battery has reached a threshold capacity due to battery discharge, terminate the battery discharge test and switch the power supply off of the battery backup.

The executable instructions, when executed, may further cause the at least one processor to receive a one-click selection input at a user interface on the remote device and send the battery test command in response to the one-click selection input. The executable instructions, when executed, may further cause the at least one processor to compare the monitored voltage and discharge current of the battery with battery specification data and determine that the battery has reached the threshold capacity based on the comparison.

The executable instructions, when executed, may further cause the at least one processor to receive a battery test command from a user interface on a remote device, by receiving the battery test command by control and access logic operatively coupled to the power supply, over a network connection. The executable instructions, when executed, may further cause the at least one processor to switch the power supply to the battery backup in response to the battery test command, by controlling at least one relay to switch the power supply to the battery backup in response to the battery test command. The executable instructions, when executed, may further cause the at least one processor to receive the battery test command by data manager and interface logic over a network, forward the battery test command to control and access logic at the power supply, and provide measurement data to the remote device by the data manager and interface logic. The measurement data includes voltage and discharge current of the battery measured by the control and access logic and by the data manager and interface logic. The executable instructions, when executed, may further cause the at least one processor to generate and email a battery test report conforming to a plurality of configurable report settings in response to termination of the battery discharge test.

The present disclosure provides an apparatus that includes a data manager and interface logic with a plurality of interface ports including at least one network interface port. The data manager and interface logic is operative to obtain digital and analog data, via the plurality of interface ports, from a plurality of digital and analog device types, where the data includes device operating parameters and alert condition notifications related to device faults or potential device failure. The data manager and interface logic is also operative to write and email a report conforming to a plurality of configurable report settings in response to occurrence of a device alert condition or a specified reporting interval, obtain updates to the device operating parameters from a remote device over the at least one network interface port, and provide the updates to corresponding devices over the plurality of interface ports.

The apparatus may further include at least one power supply operatively coupled to control and access logic, with the control and access logic operatively coupled to the data manager and interface logic. The control and access logic is operative to monitor the power supply for fault conditions, send control commands to local fault reporting devices in response to detection of a fault condition, and enable the data manager and interface logic access to fault report data corresponding to the fault condition.

The apparatus may further include a battery charger operatively coupled to the power supply and to the control and access logic. The control and access logic may further monitor the battery charger for fault conditions, obtain battery charger programming commands from the data manager and interface logic, update battery charger data in response to the programming commands, and control switching to battery power in response to a fault condition of the power supply, or a loss of AC power to the power supply.

The data manager and interface logic may also provide a navigable graphical user interface accessible by a remote device and operable to receive inputs and provide the inputs to the data manager and interface logic over the network interface port.

The data manager and interface logic may also detect and identify each device of the plurality of digital and analog device types, determine an alert condition for each device, and write and email the report individually for each device in response to occurrence of a device alert condition for a corresponding individual device.

The computer readable memory may be any suitable non-volatile memory such as, but not limited to programmable chips such as EEPROMS, flash ROM (thumb drives), compact discs (CDs), digital video disks (DVDs), etc., that may be used to load executable instructions or program code to devices such as, but not limited to, those described in further detail herein below.

The present disclosure also provides an apparatus having at least one processor, and memory operatively coupled to the processor, wherein the memory contains instructions for execution by the at least one processor, such that the at least one processor upon executing the instructions is operable to provide a power management system configuration graphical user interface (GUI) for display on a remote device in communication with the at least one processor over a network. The GUI includes a navigable initial page having a plurality of selections; a plurality of input pages, navigable to by selecting corresponding selections of the plurality of selections of the navigable initial page, the input pages including inputs for configuring alert conditions triggering email output notifications, sender email account settings, recipient email address settings, email report content settings, and device parameter settings for a plurality of power management system devices including a power supply and a battery charger.

The input pages of the GUI may also include an email report content setting page corresponding to each power management system device of the plurality of power management system devices, where the email report content setting page includes a list of selectable parameters that are selectable for inclusion in an email report. A battery charger setting page of the GUI includes a list of settable values, settable by entries into the input page. The GUI may be accessed using a browser, such as a Web browser, operating a remote device connected over a network such as an intranet or the Internet.

Therefore the present disclosure provides an apparatus for remote monitoring and control of, among other things, power supply/charger parameters and remote battery discharge testing. The remote monitoring and control and remote battery discharge testing may be facilitated over a network such as, but not limited to, an intranet or the Internet. Among other advantages, the various embodiments enable sending data related to critical parameters of a power supply/charger and/or other connected devices to a remote device. The parameters may include any critical voltage, current, battery information and status of other devices connected to a power management system.

The disclosed embodiments allow a system operator to monitor critical system parameters in real time. A system operator may program email alert trigger conditions so that an alert email will be sent out automatically when the trigger condition is met. The embodiments also enable an operator to set or change operating parameters of the power management system remotely.

The disclosed embodiments include a digitally accessible power supply/charger for which critical parameters can be measured without the need of external sensors. Programmable operating parameters can also be controlled via the remote interface.

Among the various advantages is the realization of significant cost savings in system maintenance by implementing a method to remotely obtain information necessary to diagnose a potential problem and change the operating parameters from a remote location. That is, the embodiments enable advance notification of a pending problem by a remote report generating capability thus providing the benefit of implementing preventative maintenance measures prior to direct failure of the system.

Figure 3:
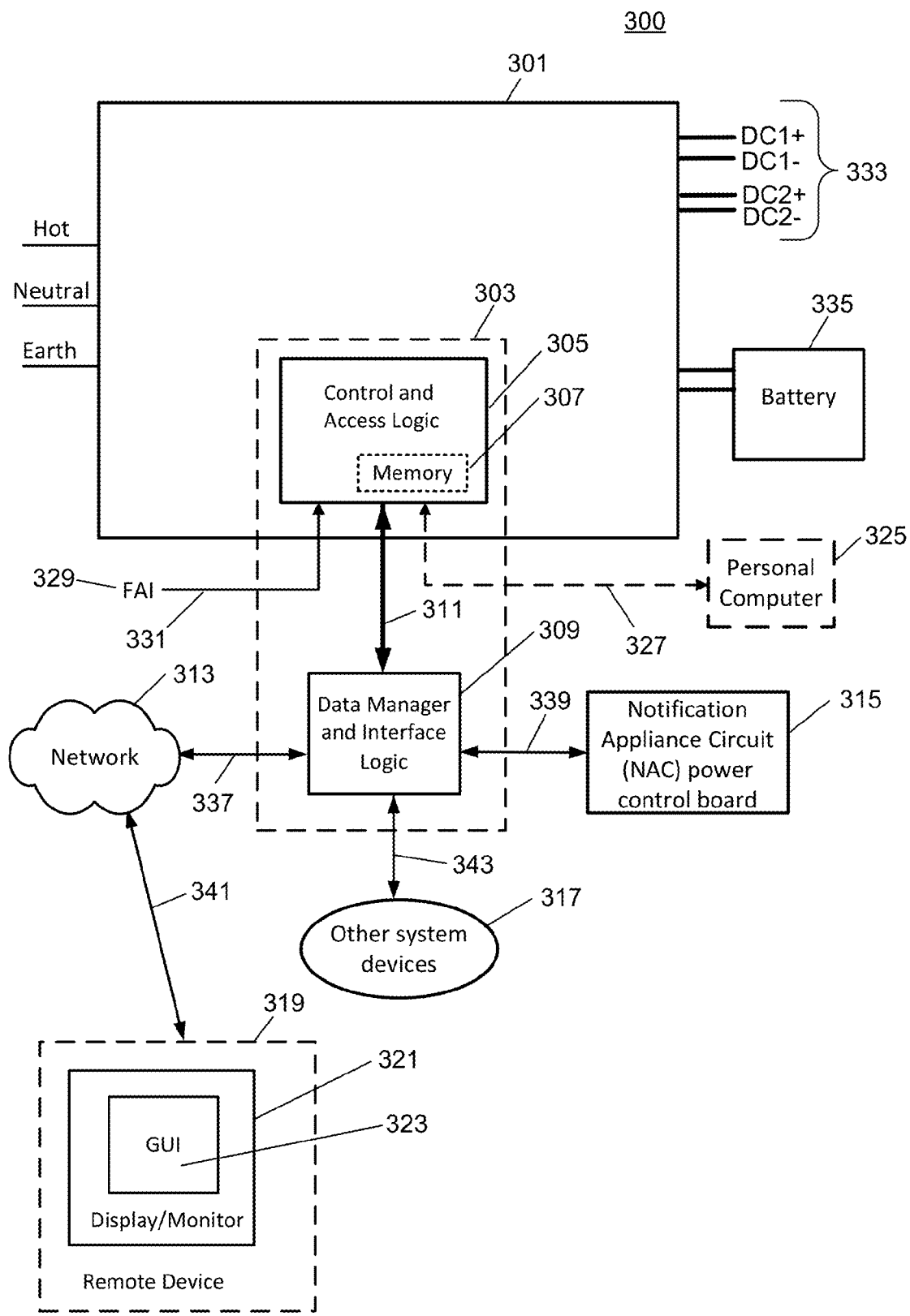
FIG. 3 is a diagram of a power management system in accordance with the embodiments.

Turning now to the drawings wherein like numerals represent like components, FIG. 3 illustrates a power management system 300 in accordance with the embodiments. The power management system 300 includes a main power supply/charger board 301 which provides DC voltage outputs 333 and which is connected to a battery 335. The power management system 300 of the embodiments includes a control, access and interface (CAI) apparatus 303. The CAI apparatus 303 may be physically located on the main power supply/charger board 301 in some embodiments, or, in other embodiments, may consist of portions where one portion is located on the power supply/charger board 301 and another portion is located off-board and operatively coupled via an interface 311. For example, as shown in FIG. 3, the CAI apparatus 303 may include control and access logic 305, which may be physically located on the main power supply/charger board 301 and operatively coupled to an external data manager and interface logic 309 via the interface 311.

The CAI apparatus 303 is operative to receive a Fire Alarm Interface (FAI) signal 329 over a coupled FAI interface 331, and is also operatively coupled to other system devices 317 via an interface 343. For example, the control and access logic 305 may receive the FAI signal 329 and the data manager and interface logic 309 may be operatively coupled to the other system devices 317. The data manager and interface logic 309 may be operatively coupled to a Notification Appliance Circuit (NAC) power control board 315 over an interface 339. The NAC power control board 315 receives DC voltage inputs 363 which may be provided by the main power supply/charger board 301. The data manager and interface logic 309 may also provide connectivity to a network 313 over an interface 337 to provide remote access in accordance with the embodiments.

For example, in accordance with the embodiments, a remote device 319 may connect to the network 313 over connectivity 341 and access features, parameters, settings, etc. of the power management system 300 such as, but not limited to, parameters and/or settings of the main power supply/charger board 301, parameters and/or settings of the other system devices 317 and parameters and/or settings related to the NAC power control board 315. The remote device may be any suitable connectable device having a display or monitor 321 suitable for displaying a graphical user interface (GUI) 323. For example, the remote device 319 may be a personal computer (PC), laptop, tablet PC, mobile phone, etc., in accordance with the embodiments. The GUI 323 is accessible by the remote device 319 by using a browser, such as a Web browser, and is navigable to various pages such as Web pages. The remote device 319 may also, in accordance with the embodiments, receive email reports related to the parameters and/or settings of the power management system 300.

The control and access logic 305 and the data manager and interface logic 309 may be implemented in various ways in accordance with the embodiments. That is, the "logic" disclosed herein, in accordance with the embodiments, may be implemented using one or more programmable processors with software and/or firmware executing thereon, ASICs, DSPs, hardwired logic or combinations thereof. Additionally, the control and access logic 305 and the data manager and interface logic 309 may include integrated and/or external memory used to store various software and/or firmware modules, in accordance with the embodiments, where such modules include executable instructions for execution by one or more programmable processors. For example, control and access logic 305 may include an integrated memory 307 as shown in FIG. 3.

The CAI apparatus 303 also provides an access interface 327 for access by a remote device such as personal computer (PC) 325, which may be a tablet, laptop, or any other suitable computing device including handheld computing devices. In some embodiments, the PC 325 may connect via access interface 327 to the control and access logic 305. The PC 325 may then access parameters and/or settings of the power management system 300 in accordance with the embodiments. The PC 325 may also access the GUI 323 using a browser, such as a Web browser.

Figure 4A:
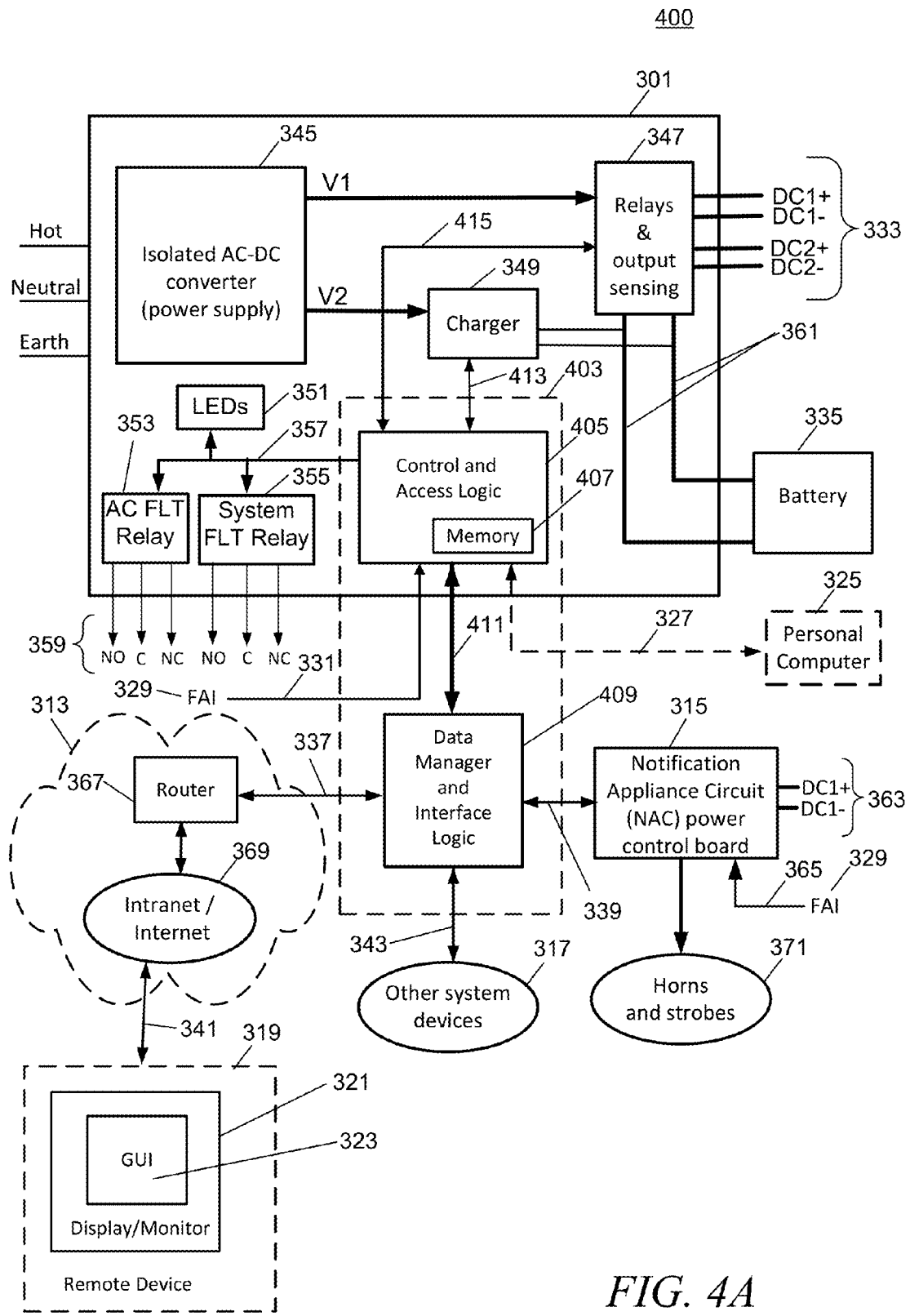
FIG. 4A is a diagram of a power management system in accordance with one embodiment.

FIG. 4A provides details of a power management system 400 in accordance with one embodiment. In the embodiment illustrated in FIG. 4A, the CAI apparatus 403 includes a control and access logic 405 which may be a microcontroller and which may include memory 407. The memory 407 may be an on-chip EEPROM in some embodiments. The control and access logic 405 is operatively coupled to data manager and interface logic 409, which also provides a network interface capability, for example an Ethernet interface capability, wireless network interface such as Wi-Fi, and/or some other suitable network interface, in the exemplary embodiment of FIG. 4A. The interface 411 operatively coupling the control and access logic 405 to the data manager and interface logic 409 may be a serial interface and may be a Serial Peripheral Interface (SPI) in some embodiments. The control and access logic 405 is also operatively coupled to battery charger 349 via an interface 413 which may include a digital-to-analog converter, a filtered PWM signal, analog-to-digital converters, GPIO pins or a serial interface. The control and access logic 405 is operative to receive setting parameter data from the charger 349, and may send configuration or setting commands to the charger 349 to control operation. The control and access logic 405 is also operatively coupled to the isolated AC-DC converter 345 which is also referred to herein as a "power supply" or as "power supply 345." The control and access logic 405 receives, among other things, voltage information from the power supply 345 via an interface 415. The interface 415 provides multiple control and data lines to both receive information and to send control signals. In other words, the control and access logic 405 may receive, among other information, voltage information from the power supply 345 via a voltage divider output, where the voltage divider is located in the relays and output sensing unit 347. The control and access logic 405 is also operative to provide relay control commands to relays and output sensing unit 347 in order to switch the power management system 400 to battery 335 power in the event of a power supply 345 fault condition or a loss of AC power. The relays and output sensing unit 347 is operatively coupled to the battery 335 via the battery leads 361 and may have internal voltage and current sensors coupled to one or both of the battery leads 361.

The control and access logic 405 is also operatively coupled to on-board LEDs 351 and to AC fault relay 353 and System fault relay 355, over an interface 357. The AC fault relay 353 and System fault relay 355 provide sets of output contacts 359 that may include normally open (NO), normally closed (NC) or continuous voltage (C) type outputs. The control and access logic 405 is operative to turn specific LEDs of the LEDs 351 on or off in response to appropriate conditions. The control and access logic 405 likewise is operative to send relay control signals to AC fault relay 353 and System fault relay 355 over the interface 357.

The power management system 400 includes the main power supply/charger board 301. The main power supply/charger board 301 includes the isolated AC-DC converter 345 (or "power supply 345") which provides two DC power outputs V1 and V2. The V1 output is a main DC power output and the V2 output is provided to a battery charger 349 which includes related battery charger circuitry. The V1 main DC power output is provided to relays and output sensing unit 347, and may be used to provide input to a voltage divider to provide an appropriate voltage level as a sensing input to the control and access logic 405 over interface 415. A battery 335 is operatively coupled to the charger 349 and to the relays and output sensing unit 347. The battery 335 is rechargeable and supplies power in the event of an AC power outage. Additionally, in accordance with the embodiment illustrated in FIG. 4A, the battery voltage and current can be monitored via the control and access logic 405.

In the embodiment illustrated in FIG. 4A, the data manager and interface logic 409 is operatively coupled to the Notification Appliance Circuit (NAC) power control board 315. The NAC power control board 315 obtains power from the main power supply/charger board 301 and receives an FAI signal 329 from a Fire Alarm Control Panel (FACP) (not shown) via an interface 365. The output of the NAC power control board 315 drives and synchronizes multiple horns and strobes 371 when an FAI signal 329 is received over the Fire Alarm Interface (FAI) 365.

In accordance with the embodiment illustrated in FIG. 4A, a personal computer (PC) 325, or other suitable computing device, may be connected to the main power supply/charger board 301 to configure the main power supply/charger board 301 and to observe critical parameters of the isolated AC-DC converter 345 and charger 349. The PC 325 may be connected to the control and access logic 405 via a serial link as the access interface 327. It is to be understood that the PC 325 is not connected to the power management system 400 permanently, but is only connected during installation or servicing.

The control and access logic 405, in accordance with the exemplary embodiment shown in FIG. 4A, is operative to perform various logic control functions such as fault detection and protection, including detecting "input voltage out of range," "output voltage out of range," "output over-load/short circuit," "battery not present," "output positive" or "negative short to earth ground," and "over-temperature." The control and access logic 405, in accordance with the exemplary embodiment, is also operative to control the DC2 output, of DC outputs 333, based on FAI signal 329 status (for example, can be set to "fail safe" or "fail secure" mode). The control and access logic 405 is also operative to program the charger 349 output current, perform battery power and AC power transfer, control the system fault relay 355 and AC fault relay 353, control LED indicators 351, and provide serial communication via interface 411, via for example a serial link, SPI, I²C or UART, to the data manager and interface logic 409 and to the PC 325.

The data manager and interface logic 409, in the exemplary embodiment of FIG. 4A, provides, among other things, a network interface such as an Ethernet interface and may be connected to the network 313 via a router 367 coupled using, for example, an Ethernet cable for the interface 337. The data manager and interface logic 409 may also be connected to other system devices 317 for the purpose of data collection and control.

Figure 4B:
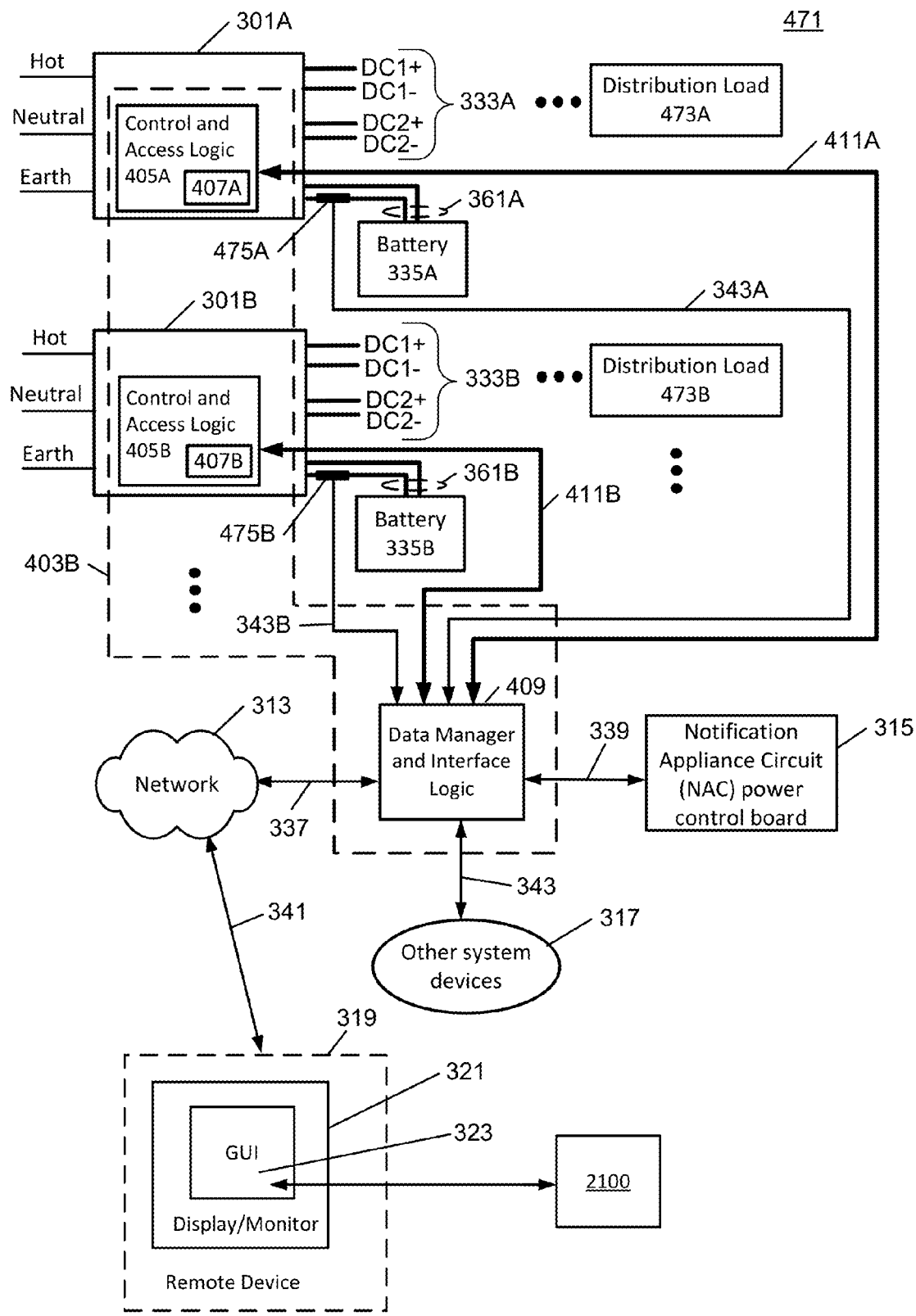
FIG. 4B is a diagram of a power management system with remote battery testing capabilities in accordance with an embodiment.

FIG. 4B is a diagram of a power management system 471 with remote battery testing capabilities in accordance with an embodiment. In the power management system 471, one or more power supply/charger boards may be present in a CAI apparatus 403B such as power supply/charger boards 301A and 301B. As described with respect to FIG. 3 and FIG. 4A, each power supply/charger board 301A and 301B includes respective control and access logic 405A and 405B (with respective memory 407A and 407B) which controls a respective relays and output sensing unit 347 (not shown if FIG. 4B) in each power supply/charger board 301A and 301B as shown in FIG. 4A with respect to the example power supply/charger board 301. That is, each control and access logic 405A, 405B is operative to control respective relays and output sensing units 347 on each power supply/charger board 301A and 301B to switch respective distribution loads 473A and 473B from AC power to battery backup power via respective batteries 361A and 361B. The respective relays and output sensing units 347, as described with respect to FIG. 4A, include voltage metering and current metering to measure voltage and current on the respective DC voltage outputs 333A and 333B that drive the distribution loads. The current metering of the respective relays and output sensing units 347 may also measure the battery 335A and 335B discharge currents on the respective battery leads 361A and 361B. Both the control and access logic 405A and 405B communication with the data manager and interface logic 409 over respective interfaces 411A and 411B.

The data manager and interface logic 409 also has interfaces 343 that include Hall current sensors that convert current inputs to a 0-5V signal. The interfaces 343 will be described further below with respect to FIG. 5. In some embodiments, a current sensor 475A may be connected to the battery 335A battery leads 361A to provide a current signal to the data manager and interface logic 409 directly using the interfaces 343, i.e. interface 343A. Battery 335B would likewise have a similar current sensor 475B connected to battery leads 361B to also provide a current signal via one of the interfaces 343, i.e. interface 343B.

In accordance with the embodiments, the CAI apparatus 403B provides the capability to remotely initiate a battery discharge test on the distribution loads 473A or 473B. In one example of operation, a user may access a power supply/charger data page 2100 of the GUI 323 to control the battery discharge test. One example method of operation is described in detail below with respect to an example of the power supply/charger data page 2100 provided in FIG. 21 and with respect to the flowchart of FIG. 22. Briefly, during remote battery test methods of operation, one or more batteries under test will be connected to a respective distribution load and monitored. For example, if battery 335A is under test, a remote battery test command may be initiated using the power supply/charger data page 2100 of the GUI 323 from remote device 319. The data manager and interface logic 409 will receive the command over the network 313 and pass the command to the control and access logic 405A over the interface 411A. The control and access logic 405A will control the corresponding relays and output sensing 347 to switch the distribution load 473A from AC power to battery power from the battery 335A.

The battery voltage and discharge current may then be monitored by the control and access logic 405A, or by both the control and access logic 405A and the data manager and interface logic 409 concurrently. That is, the control and access logic 405A may monitor the battery voltage and current using the relays and output sensing unit 347, and report the measurements to the data manager and interface logic over the interface 411A. In some embodiments, the data manager and interface logic 409 may alternatively, or in addition, monitor the discharge current on battery leads 361A using current sensor 475A which provides the current measuring over interface 343A.

A soft "battery meter" may then be displayed on the power supply/charger data page 2100 of the GUI 323 to indicate the "State of Charge" (SoC) for the battery 335A as the discharge test progresses. The SoC may be calculated based on user entered battery Amp-Hour values versus discharge current and discharge time for battery 335A. When battery 335A is discharged down to some threshold capacity, the test will be terminated, and the distribution load 473A is switched back to the power supply/charger board 301A output from the isolated AC-DC converter 345 (i.e. the power supply) as shown in FIG. 4A. One example threshold capacity may be about 5% of the battery capacity however other thresholds may be used. The battery discharge test termination condition may be determined, for example, by comparing the battery voltage and discharge current with the battery manufacturer's datasheet.

Critical power supply parameters are sensed by the control and access logic 405 and stored in the memory 407, which may be an on-chip EEPROM in some embodiments as was mentioned above. The critical parameters are saved periodically (for example, hourly) and at the instance when any fault condition is detected. Table 1 provides a list of the parameters that may be stored in memory 407.

TABLE 1

Parameters stored in memory for user and service personnel access

| Variable Description | Number of bytes | Variable type | Access | Variable range | comments |
|---|---|---|---|---|---|
| Device ID | 1 | Unsigned integer | User: Read only Svc: read only | 0-255 | This is device identification |
| Model number | 1 | Unsigned integer | User: Read only Svc: read only | 0-255 | Mapped to actual model number of power supply. |
| Total Power-on Time in hours | 3 | Unsigned integer | User: Read only Svc: read only | 0-16777215 | This datum is useful during customer return servicing |
| Total number of AC FLT relay activation | 2 | Unsigned integer | User: Read only Svc: Read/Write | 0-65535 | This datum is useful during customer return servicing |
| Total number of SYS FLT relay activation | 2 | Unsigned integer | User: Read only Svc: Read/Write | 0-65535 | This datum is useful during customer return servicing |
| Total battery connection time in hours | 3 | Unsigned integers | User: Read/Write Svc: Read/Write | 0-16777215 | User resettable when replacing battery. |
| AC fault reporting delay in Hr:Min:Sec | 3 | Unsigned integers | User: Read/Write Svc: Read/Write | Second: 0-60 Minute: 0-60 Hour: 0-255 | User programmable delay time (overwriting the default value) |
| System fault reporting delay in Hr:Min:Sec | 3 | Unsigned integer | User: Read/Write Svc: Read/Write | Second: 0-60 Minute: 0-60 Hour: 0-255 | User programmable delay time (overwriting the default value). |
| Charging current sealer N (Default current divided by 2^N) | 1 | Unsigned integer | User: Read/Write Svc: Read/Write | 0-4 (minimum charge current is 1/16 of the full current) | User programmable charging current, scaled to 1/2, 1/4, 1/8 or 1/16 of the default/nominal current (overwriting the default value). |
| Power supply status word | 4 | hex | User: Read only Svc: Read only | 00000000-FFFFFFFF | Updated every period & when main output relay is shut off due to fault. |
| Battery voltage | 2 | Unsigned integers | User: Read only Svc: Read only | 0 to 1023 | Battery voltage reading from 10-bit ADC |

TABLE 1-continued

Parameters stored in memory for user and service personnel access

| Variable Description | Number of bytes | Variable type | Access | Variable range | comments |
|---|---|---|---|---|---|
| Charger current | 2 | Unsigned integers | User: Read only<br>Svc: Read only | 0 to 1023 | Charger output current reading from 10-bit ADC |
| Charger current offset | 2 | Unsigned integers | User: Read only<br>Svc: Read only | 0 to 1023 | Battery current offset value (charger current ADC reading when charging current is 0). |
| Fault pin voltage | 2 | Unsigned integers | User: Read only<br>Svc: Read only | 0 to 1023 | Fault pin voltage reading from 10-bit ADC |
| AC feedback voltage | 2 | Unsigned integers | User: Read only<br>Svc: Read only | 0 to 1023 | AC feedback voltage reading from 10-bit ADC |
| Earth ground pin voltage | 2 | Unsigned integers | User: Read only<br>Svc: Read only | 0 to 1023 | Earth ground pin voltage reading from 10-bit ADC |
| DC output voltage reading | 2 | Unsigned integers | User: Read only<br>Svc: Read only | 0 to 1023 | DCout_AD pin voltage reading from 10-bit ADC |
| SMPS output voltage | 2 | Unsigned integers | User: Read only<br>Svc: Read only | 0 to 1023 | Vout_AD pin voltage reading from 10-bit ADC |

In accordance with the embodiments, information from the power management system 400 and the main power supply/charger board 301 etc. may be conveyed and/or stored using a Power Supply Status Word (PSSW) that may consist of 4 bytes in some embodiments. For example, a PSSW may consist of two higher significant bytes and two lower significant bytes, where the two higher significant bytes are reserved for future use, and the two lower significant bytes have a format and utilization as illustrated in Table 2 below:

TABLE 2

Lower significant 16 bits of the PSSW

| Bit # | Bit Name | Description |
|---|---|---|
| 0 | EN VOUT | DC output enable:<br>Hi = Output relay selects SMPS<br>Lo = Output relay selects Battery |
| 1 | EN BAT | Battery SCR transition enable, positive logic:<br>Hi = enable SCR<br>Lo = disable SCR |
| 2 | EN_CHARGER | Enable charger, negative logic:<br>Hi = Disable charger output<br>Lo = Enable the charger output |
| 3 | EN_GNDFLT_LED | Enable ground fault reporting LED:<br>Hi = GND fault LED turned on<br>Lo = GND fault LED turned off |
| 4 | Vout_DETECT | Output voltage setting detection (12 or 24 V setting):<br>Hi = 24 V<br>Lo = 12 V |
| 5 | BAT_Presence | Battery presence detection signal<br>Hi = detect and report missing battery or battery voltage too low<br>Lo = do not detect/report missing battery |
| 6 | OVER_TEMP | Over-temperature fault signal<br>Hi = Over-temperature occurred<br>Lo = No Over-temperature |
| 7 | FAL_LOVAC | AC fault signal to AC FLT relay and LED, reverse logic<br>Hi = AC input voltage is normal<br>Lo = AC FLT occurred |
| 8 | FLT_SYSTEM | System fault signal to SYS FLT relay and LED, reverse logic<br>Hi = AC System is normal<br>Lo = SYS FLT occurred |

TABLE 2-continued

Lower significant 16 bits of the PSSW

| Bit # | Bit Name | Description |
|---|---|---|
| 9 | FAI_OPTION | User setting whether to latch FAI state once triggered<br>Hi = latch FAI state (user jumper connected)<br>Lo = do not latch FAI state |
| 10 | FAI_SIG | FAI signal sensed by MCU<br>Hi = FAI activated<br>Lo = No FAI signal |
| 11 | FAI_OUT | Enable FAI LED (red)<br>Hi = FAI LED turned on, FAI relay energized.<br>Lo = FAI LED turned off, FAI relay not energized. |
| 12 | X | Reserved for future use |
| 13 | X | Reserved for future use |
| 14 | X | Reserved for future use |
| 15 | X | Reserved for future use |

In addition to the above described information, the NAC power control board 315 also stores critical parameters that may be accessed using the CAI apparatus 403. The NAC power control board 315 includes NAC logic which may be, for example, a microcontroller and a memory, in accordance with one embodiment. The parameters stored by the NAC power control board 315 are listed in Table 3 below.

TABLE 3

NAC power control board parameters

| Variable Name | Value Range | Notes |
|---|---|---|
| Device ID | NAC1, NAC2, NAC3, . . . , NAC9 | One model, multiple boards |
| Fault condition | TRUE, FALSE | TRUE = fault, FALSE = not fault |
| FAI activation | TRUE, FALSE | TRUE = Alarm, FALSE = no alarm |
| NAC operation mode | Supervisory, Alarm | Supervisory = in supervisory mode; Alarm = in alarm mode |

In accordance with the embodiments, all the above illustrated parameters from the power management system 400, that is, all parameters from the main power supply/charger board 301 as well as from the NAC power control board 315, can be accessed using either the local PC 325 via serial data link as access interface 327, or remote device 319 via network 313 which may include intranet/Internet 369.

Figure 5:
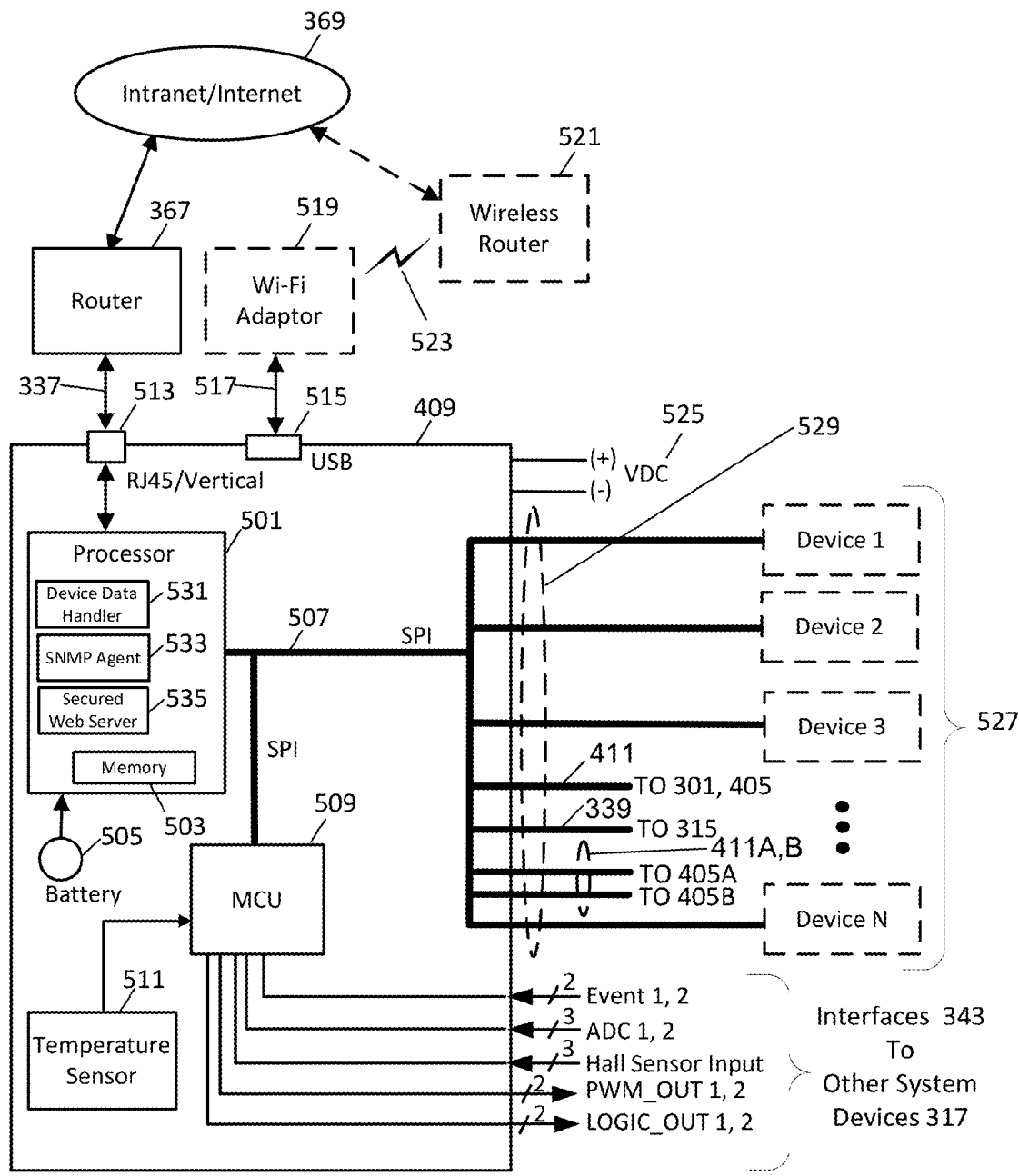
FIG. 5 is a diagram providing details of the data manager and interface logic shown in FIG. 4A and FIG. 4B, in accordance with an embodiment.

Turning to FIG. 5, further details of the data manager and interface logic 409 are provided. As was discussed above, in the exemplary embodiment illustrated in FIG. 4A and FIG. 5, the data manager and interface logic 409 may provide an Ethernet interface for network connectivity in some embodiments. However, other suitable interfaces for network connectivity may be provided in other embodiments. The data manager and interface logic 409 may include a processor 501, which in some embodiments may be an ARM processor, and which may include integrated memory 503. The memory 503 may be a flash memory and may also be external from the processor 501 in some embodiments. The processor 501 executes instructions and runs an operating system such as, for example, Linux or Windows CE™. The processor 501 is operative to perform the tasks of network (such as, but not limited to, Ethernet) communication protocol, device data collection and parameter setting via an interface such as, but not limited to, Serial Peripheral Interface (SPI) bus 507 connection, data presentation through web pages, email alert arbitration and execution, and Simple Network Management Protocol (SNMP) network management software. The processor 501 is equipped with a real time clock which is maintained by a battery 505 in the event that the processor 501 loses power from the voltage inputs 525.

The data manager and interface logic 409 may also include an RJ45 connector 513 to enable connection to the Internet or intranet 369 via router 367 over the interface 337 using, for example, an ANSI Category 5 cable. The data manager and interface logic 409 may also include a USB port 515 to enable connection to, for example, a Wi-Fi adaptor 519 using a USB cable 517. That is, in some embodiments, the data manager and interface logic 409 may communicate with the Internet/intranet 369 via a wireless link 523 between a USB connected Wi-Fi adaptor 519 and a wireless router 521 as illustrated in FIG. 5.

The data manager and interface logic 409 includes an internal SPI bus 507 such that the processor 501 is operatively coupled to an MCU 509 and also to a plurality of external, digitally accessible devices 527 via a plurality of external SPI ports 529. The external, digitally accessible devices 527 that are operatively coupled to the data manager and interface logic 409 include the main power supply/charger board 301, which is operatively coupled via interface 411, as well as the NAC power control board 315 which is operatively coupled via interface 339 as is also illustrated in FIG. 4A. The plurality of external, digitally accessible devices 527 consist of two device types: the power supply boards (which may include several different model numbers at different power ratings) and the NAC power control board 315. The devices 527 may be installed and physically located inside a same cabinet housing the data manager and interface logic 409. In the exemplary embodiment illustrated in FIG. 4A, only one power supply board and one NAC power control board 315 are used. The main power supply/charger board 301 of the embodiments is digitally accessible due to control and access logic 405 which collects and provides access to critical parameters via the SPI interface 411 as was discussed previously above.

The processor 501 is operative to read critical parameters of the plurality of devices 527 over the SPI bus 507 and provide the parameters to a remote device 319. The parameters may be sent to the remote device 319 over a network, for example intranet/Internet 369. Some of the device operating parameters can also be set using the GUI 323 which is displayed on the remote device 319. In other words, the data manager and interface logic 409 is operative to receive parameter settings, values, etc., from the GUI 323 of the remote device 319, and, in response, update corresponding device parameter settings, values, etc. Examples of the parameters that can be controlled via the remote device 319 include "Set battery charge current," "Set report delay time for AC fault," "Set report delay time for System fault," "Reset battery "hours of service" counter," "Reset AC fault counter," "Reset System fault counter," "Turn on/off the AC-DC converter output (testing battery operation mode)," and "Forcing on/off the FAI_OUT state" (for DC2 output reset).

The MCU 509 also collects data that are not sensed by the plurality of digitally accessible devices 527, such as voltage, current and logic signals from other system devices 317. The MCU 509 can measure any DC voltage outputs via an on board analog-to-digital converter (ADC) and can measure any current via Hall sensor inputs. The MCU 509 can also sense external events such as, for example, an external device failure condition. An external event example is to sense the tamper switch state on the equipment housing cabinet door. If the cabinet door is tampered with, the tamper switch state will be sensed by the MCU 509 and an event input will be activated. In accordance with the embodiments, the event input may be pre-programmed as one of various email alert trigger conditions, and an email alert will be sent out to a system operator to report the incident.

The measured data from other system devices 317 are sent from the MCU 509 to the processor 501 via the internal SPI bus 507. The MCU 509 interfaces 343 include Pulse Width Modulated (PWM) and open collector/drain logic outputs that can be used to remotely activate/deactivate certain outputs. An example application of the logic output is to remotely reset the power to a surveillance camera when it gets hung up. The embodiments may also include a temperature sensor 511, which may be a temperature sensor integrated circuit (IC), that senses the housing cabinet internal temperature. The temperature data is read by the MCU 509 and sent to the processor 501 via the SPI bus 507. All the data collected by the processor 501 are time stamped and saved in memory 503, which, as discussed above, may be a flash memory.

The data manager and interface logic 409 interfaces 343 enable the MCU 509 to sense parameters including Event1, Event2 (isolated logic inputs); ADC1, ADC2, and ADC3 (0-30V range); and Hall current sensor 1, 2 and 3 (current is converted to 0-5V signal). The data manager and interface logic 409 interfaces 343 also include output control signals PWM1, PWM2, Logic_OUT1 and Logic_OUT2 (open collector, or open drain).

In accordance with the embodiment exemplified in FIG. 4A and FIG. 5, the data manager and interface logic 409 may be implemented using two processors, processor 501 and MCU 509. Further in accordance with the embodiment exemplified in FIG. 4A and FIG. 5, processor 501 may execute instructions related to various software and/or firmware modules including a secured web server 535 with an Ethernet driver; an SNMP agent 533 and a device data handler 531.

The SNMP agent 533 exposes the parameters of all connected devices to the SNMP manager at the remote location, for example, an SNMP manager on the remote device 319. The parameters are organized in a hierarchical manner by Management Information Bases (MIBs) per established standard Abstract Syntax Notation One (ASN.1).

Figure 6:
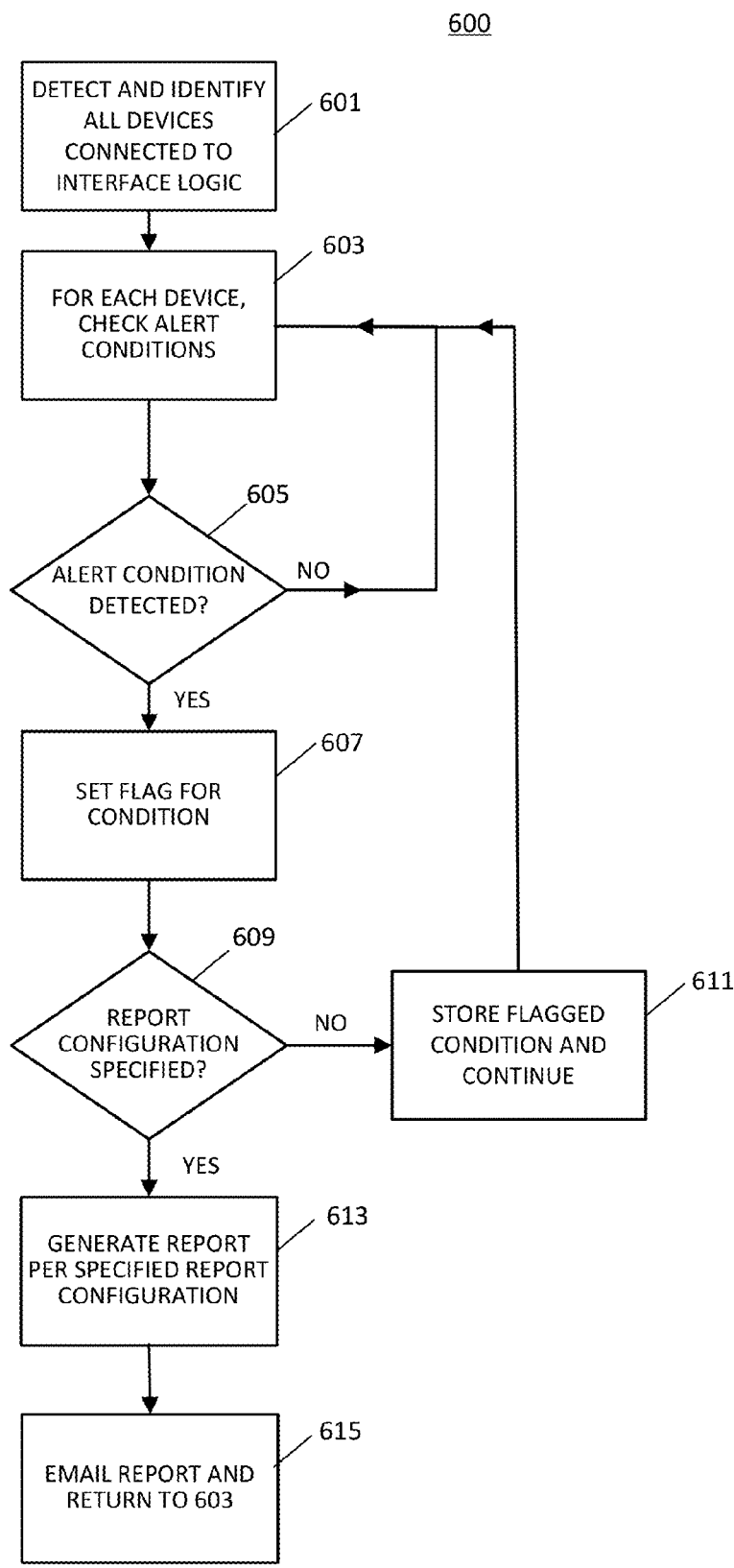
FIG. 6 is a flowchart describing high level operation of the data manager and interface logic shown in FIG. 4A, FIG. 4B and FIG. 5 in accordance with the embodiments.

FIG. 6 provides a flowchart 600 of a high level operation of the Device Data Handler module 531. As shown in FIG. 6 block 601, the Device Data Handler module 531 detects and identifies all the devices connected to the data manager and interface logic 409. In 603, for each connected device, the Device Data Handler module 531 checks the alert conditions setup by, for example, a system administrator, and sets a flag in 607 if the conditions are met in 605. The Device Data Handler module 531 generates a report in 613 according to the report configuration setup by the administrator and checked in 609. The Device Data Handler module 531 may then send an email of the report in 615 and then continue to monitor as in 603. If no report configuration is specified in 609, then in 611 the Device Data Handler 531 will store the flagged condition and continue as in 603.

In some embodiments, the Device Data Handler module 531 may read device data every 2 seconds for real time data updates and save a record every hour. For example, a total of 512 data instances, that is, data record files, may be saved in 512 data files. The first file is always the latest data at an approximately 2 second update period. The second file is the nearest hourly record. The third file is the second nearest hourly record, and so on. These data record files can be viewed from the secured web server 535 device parameter page and is discussed in further detail below.

Figure 7:
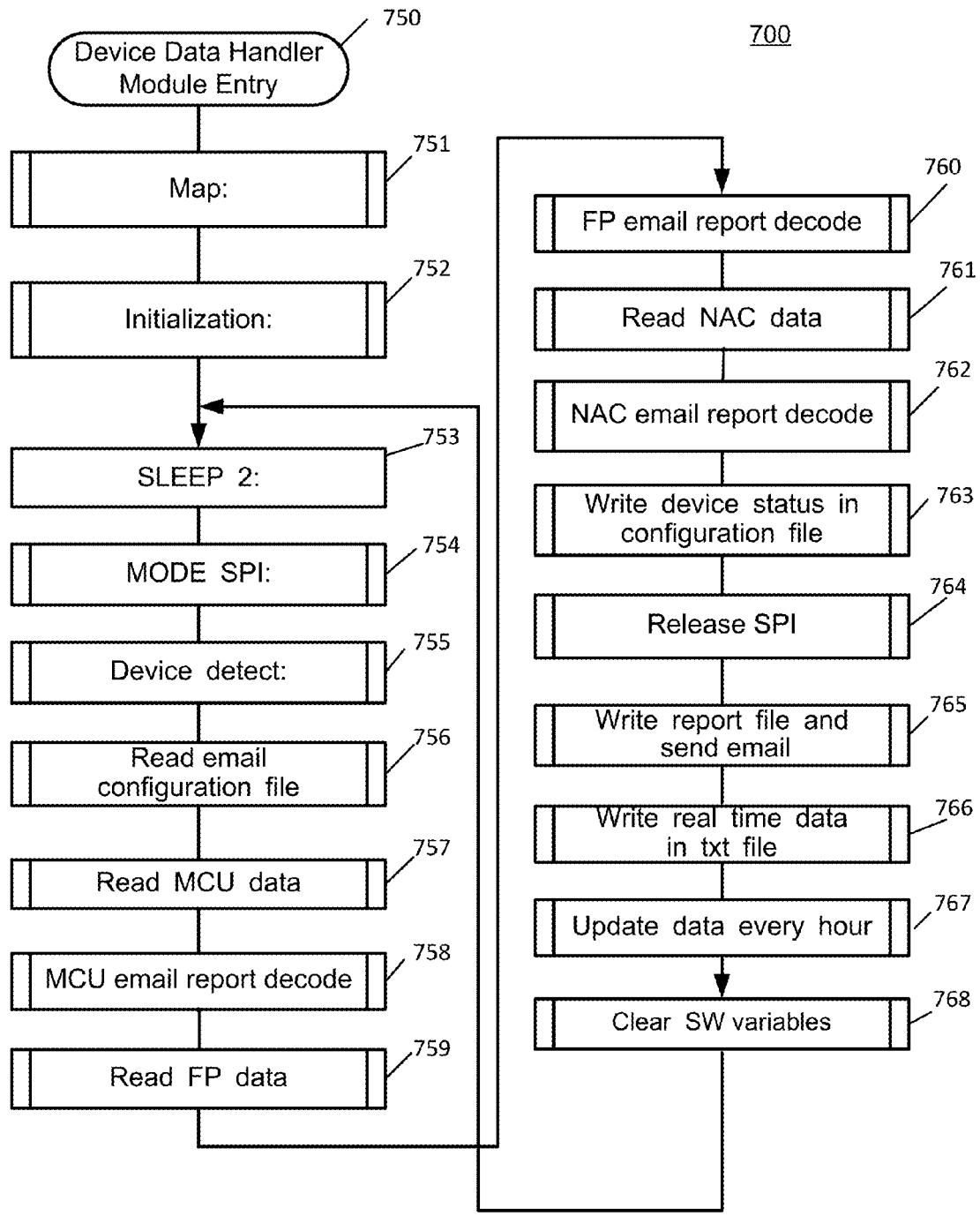
FIG. 7 is a flowchart providing further details of operation of the data manager and interface logic in accordance with the embodiments.

FIG. 7 is a flowchart 700 and provides further details of operation of the Device Data Handler module 531 executing on the processor 501. The Device Data Handler module 531 entry point is shown in 750. In 751, the processor 501 loads the memory management unit for Universal Serial Interface (USI) control. In 752, processor 501 initializes the I/O pins and variable default values. The Device Data Handler module 531 enters a wait state "SLEEP 2" as shown in 753. In 754, the processor 501 is set to "MODE SPI," that is, it sets USI to SPI operation and sets the SPI to be compatible with Device mode. In 755, the Device Data Handler module 531 scans and identifies all devices that are connected to the data manager and interface logic 409, and updates the device table. In 756, the Device Data Handler module 531 reads the specified email alert conditions and email report settings.

In 757, the Device Data Handler module 531 reads the MCU 509 data, which may include, as was discussed above, data from other system devices 317. In 758, the Device Data Handler module 531 checks the MCU 509 data against the specified email alert conditions. If an email alert condition is met, or a condition is recovered, an email request flag will be set by the Device Data Handler module 531. In 759, the Device Data Handler module 531 reads the FP type device data, i.e., the data obtained from the main power supply/charger board 301. As was described in detail above, the main power supply/charger board 301 is digitally accessible because it includes, for example, the control and access logic 405, in accordance with the exemplary embodiment shown in FIG. 4A. In 760, the Device Data Handler module 531 checks the FP device data against specified email alert conditions. If alert condition is met, or a condition is recovered, an email request flag will be set by the Device Data Handler module 531. In 761, the Device Data Handler module 531 reads the NAC type device data, for example, the data obtained from the NAC power control board 315. In 762, the Device Data Handler module 531 checks the NAC device data against the specified alert conditions. If an alert condition is met, or a condition is recovered, an email request flag will be set by the Device Data Handler module 531.

In 763, the Device Data Handler module 531 writes the device status to the configuration files for web display. In 764 the processor 501, under Device Data Handler module 531 instruction, releases the SPI mode and switches to default mode, and in 765 the Device Data Handler module 531 writes the report file according to specified email report settings and sends email to an email recipient list (which, for example, may be setup by an administrator). In 766, the Device Data Handler module 531 saves the current device data in text files for web page display. In 767, the Device Data Handler module 531 manages the hourly update of data files for web page display. In 768, the processor 501, under Device Data Handler module 531 instruction, clears software variables to free up memory and the Device Data Handler module 531 will then loop back to 753 "SLEEP 2" as shown in FIG. 7.

Therefore, as described above the data manager and interface logic 409 provides, among other advantages, the capability to collect and manage power management system 400 data from a variety of sources including digitally accessible and non-digitally accessible device types. Further, the data manager and interface logic 409 provides the advantage of enabling remote access of parameters and/or settings over a network by a remote device such as remote device 319. System operators may thereby realize reduced costs in that maintenance personnel need not always visit the location to perform certain tasks or obtain needed data. Another advantage provided by the data manager and interface logic 409 is settable email alerts and report formats as will be described in further detail below.

Figure 8:
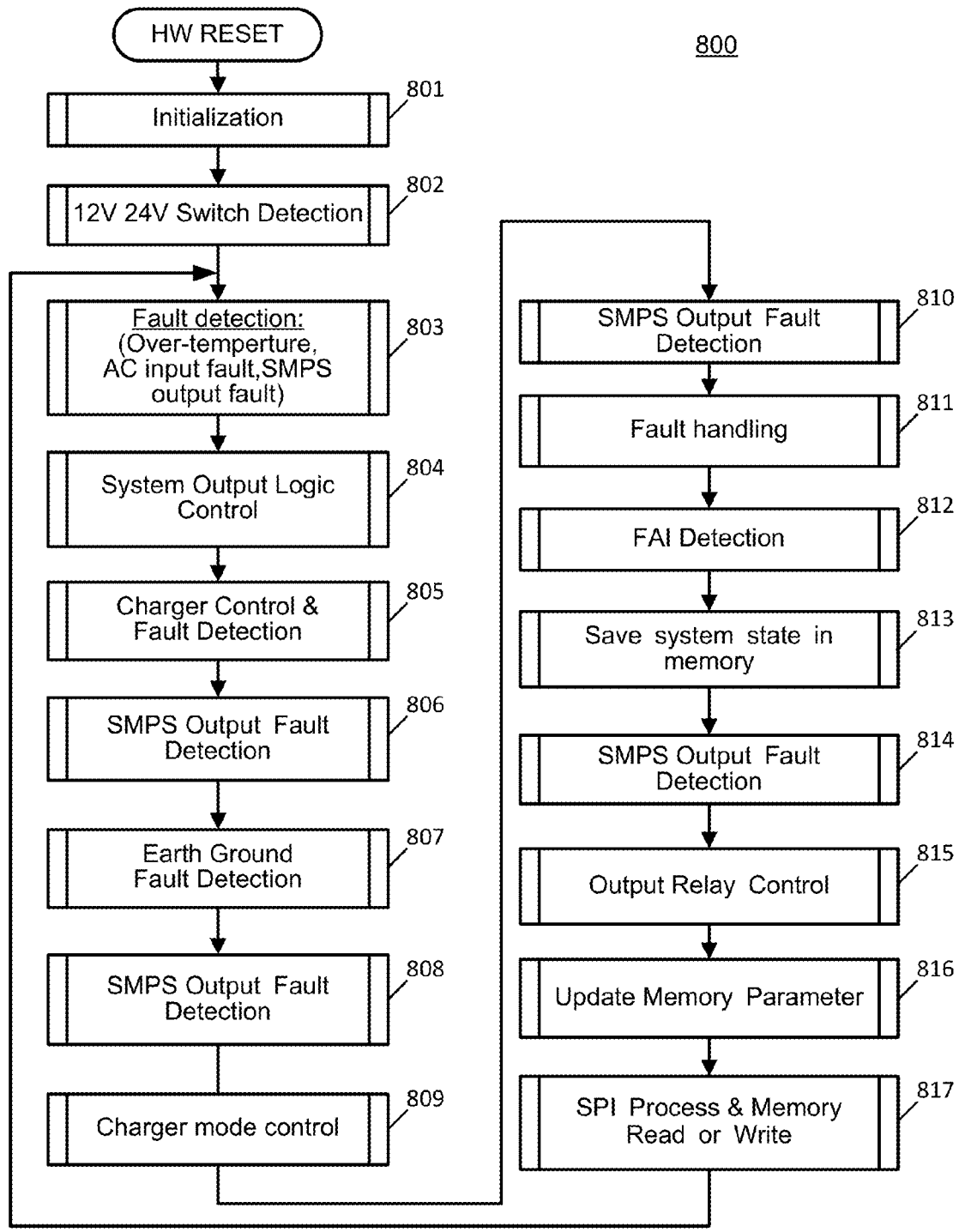
FIG. 8 is a flowchart describing high level operation of the control and access logic in accordance with the embodiments.

As discussed above, the embodiments provide a digitally accessible power supply such as the main power supply/charger board 301, and this is achieved by including the control and access logic 405. FIG. 8 provides a flowchart 800 illustrating operation of the control and access logic 405 in accordance with the embodiments. In 801, the control and access logic 405 performs initialization which includes setting the initial states of all the peripherals and initial values of all variables. In 802, the control and access logic 405 detects the voltage setting switch, which is an on-board switch, and may determine whether a given voltage is selected, for example, 12V or 24V. The control and access logic 405 is operative to read the switch setting and load the proper parameter set according to the selected voltage. In 803, the control and access logic 405 checks various fault conditions, including, for example, "over-temperature," "AC input voltage too low," and "Switch Mode Power Supply (SMPS) output voltage out of range." In 804, the control and access logic 405 performs system logic control such as, for example, switching to battery power, switching LEDs on or off, switching relays on or off, etc. In 805, the control and access logic 405 performs charger 349 control and fault detection. The charger 349 current is programmable using either the PC 325 or by the remote device 319 over the network 313. The charger 349 may have a default value set as the highest available charge current. The data communication between the charger 349 and the control and access logic 405 is over an interface 413 which may be, for example, a digital-to-analog converter, a filtered PWM signal, an analog-to-digital converter, GPIO pin, SPI or any other suitable interface. The control and access logic 405 is operative to read a programmed charge current command from the memory 407.

In 806, the control and access logic 405 performs SMPS output fault detection and may detect faults such as, for example, "voltage out of upper limit," "voltage out of lower limit," or a short circuit condition. In 807, the control and access logic 405 performs earth ground fault detection. That is, if the output positive or negative terminal is shorted to earth ground, a fault condition will be detected by the control and access logic 405.

As shown in 808, another SMPS fault detection occurs. The SMPS fault detection function is executed several times in a control cycle in order to increase the sampling rate so the system can respond to a severe fault (such as a short circuit) quickly before any component damage occurs. As shown in 809, the control and access logic 405 may implement charger 349 mode control. The charger 349 may operate in two modes; a normal charge mode when the battery capacity is below 90%, and a trickle charge mode when the battery is charged to above 90% capacity. In trickle charge mode, the battery 335 voltage is monitored to make sure that it will not exceed manufacturer specified maximum voltage which may result in damage. A third SMPS fault detection operation occurs as shown in 810 for the reasons discussed above.

In 811, the control and access logic 405 performs fault handling. For fault reporting purpose, all faults are divided into two groups; AC fault and all the other faults which are grouped as System faults. The fault handler operation of the control and access logic 405 keeps track of the length of time for each fault and compares the fault time with the fault report delay time which is programmable. Once the fault time has reached the report delay time, a fault status will be asserted by the control and access logic 405. That is, among other things, corresponding local fault reporting means will be activated. The local fault reporting may include turning on certain on-board LEDs, de-energizing the corresponding fault relay and setting a corresponding fault bit so that the local PC 325 or remote device 319 can read the data and fault report. The number of AC faults and the number of System faults are recorded and saved in memory 407.

In 812, the control and access logic 405 performs an FAI signal 329 detection operation. If a voltage is received from the on-board FAI input terminals, that is, over the FAI interface 331, the control and access logic 405 will execute the FAI response. The FAI response may include, among other things, setting an FAI bit so that PC 325 or remote device 319 can read and report the FAI condition, lighting up a red LED of the LEDs 351 located on the main power supply/charger board 301, turning the DC2 output on (if DC2 is set to "fail secure"), or off (if DC2 is set to "fail safe"). A user can set the DC 2 to "fail secure" or "fail safe" mode by selecting an on-board jumper located on the main power supply/charger board 301. Alternatively, this feature may be programmed via the remote device 319 or via the PC 325.

As shown in 813, the control and access logic 405 saves the system state in memory 407. A timer, such as for example, an on-chip timer in embodiments where the control and access logic 405 is implemented using a microcontroller, keeps track of time elapsed since power up and since the battery 335 is connected. The power up time and battery 335 connection time are cumulated and saved in memory 407. The battery 335 connection time can be reset by a user via the remote device 319 or via the PC 325. Among other advantages, this feature is useful when a service technician replaces the battery 335. The power up time is not resettable (like an odometer). An exemplary list of variables stored in memory 407 is provided in Table 1 and Table 2 which were discussed above. A fourth SMPS fault detection operation is performed by the control and access logic 405 as shown in 814.

The control and access logic 405 is also operative to perform output relay control as shown in 815. Output relay control entails turning the output relay, of relays and output sensing 347, on or off based on control logic and fault conditions. For example, at power up, the control and access logic 405 will check whether output short circuit or other faults exist. If there is no fault, the control and access logic 405 will turn on the output relay. When AC power is lost, control and access logic 405 will enable the battery 335 and turn the output relay to the battery side so that the battery 335 will supply the load. When the AC power is recovered, the output relay, of relays and output sensing 347, will be turned back to the power supply (isolated AC-DC converter 345) side again and transfer the load to the power supply output.

In 816, the control and access logic 405 updates the memory 407 parameters. In 817, the control and access logic 405 processes the SPI operation and performs a memory 407 read or write operation if commanded by the remote device 319 or by the PC 325. For example, a user, via the remote device 319 or via the PC 325, may send a request to read the parameters of the main power supply/charger board 301. In response, the control and access logic 405 will read the requested parameters from memory 407 and send them out via the SPI interface 411. In another example, a user, via the remote device 319 or via the PC 325, may send request to change some parameters, e.g. charge current. In response, the control and access logic 405 will write the new charge current command to the memory 407. The control and access logic 405 will loop back to operation 803 as shown in FIG. 8.

Therefore, among other advantages, the main power supply/charger board 301, in accordance with the embodiments herein disclosed, is a digitally accessible device. The main power supply/charger board 301 is digitally accessible because it includes control and access logic 405 in accordance with the embodiments.

The various embodiments disclosed herein also include a graphical user interface, GUI 323, which may be accessed and displayed on a remote device, such as remote device 319, in order to access the various features of the embodiments described above. The various features and capabilities of the GUI 323 will now be described in detail.

Figure 9:
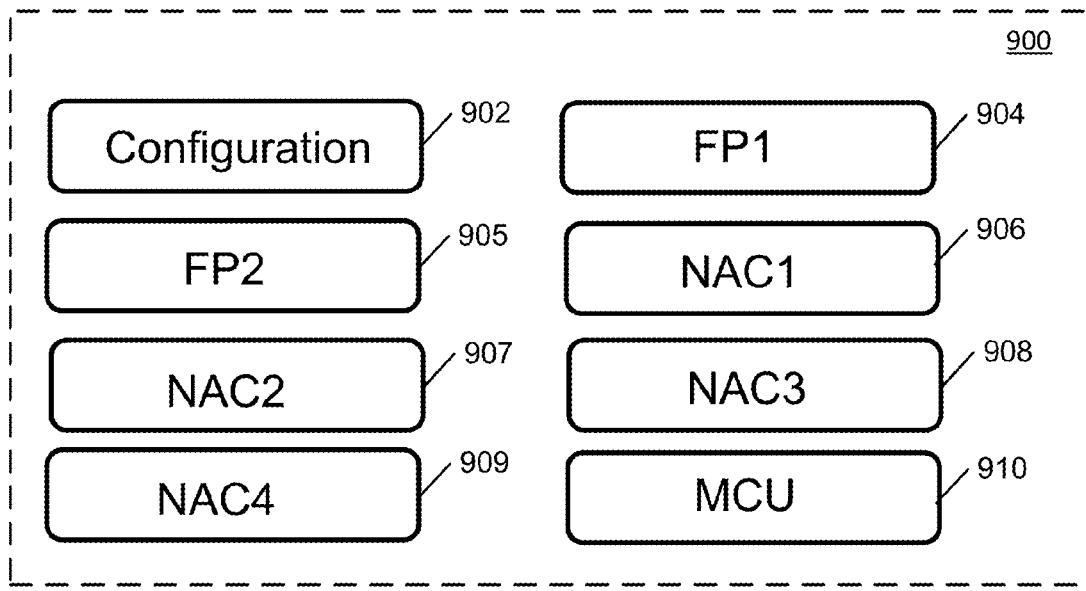
FIG. 9 is a diagram of a navigable initial page or Web page provided by a graphical user interface (GUI) feature in accordance with an embodiment.

FIG. 9 illustrates the top level contents of the secured web server 535, and an initial screen 900 of the GUI 323. The initial screen or "page" 900 provides a plurality of selectable buttons 902 through 910 as shown. Various selectable buttons and/or other selectable features of the GUI 323 may be selected in various ways in accordance with the embodiments, such as, but not limited to, mouse cursor point-and-click, touch screen, scrolling a cursor to the selectable item and hitting an "enter" key, using hot keys corresponding to the selectable feature, voice commands, etc., or any other suitable way of selecting a selectable feature using a remote device such as, for example, remote device 319. Button 902 "configuration" is used to setup, and edit system operating parameters. The remaining buttons 904 through 910 navigate to parameter pages for the various devices indicated on the button. For example, the initial screen 900 provides buttons for 2 FP devices, 4 NAC devices and an MCU. Any combination of device type/model may be connected in accordance with the embodiments. For example in one embodiment, a total of six devices may be connected.

In the exemplary embodiment of the GUI 323 that is provided by way of FIG. 9 through FIG. 20, the "FP1" button 904 navigates to the parameters page for "FP1," which may be, for example, the main power supply/charger board 301. Selecting the FP1 button 904 causes the GUI 323 to display the FP1 parameter page which provides access to the device data and allows programming of the parameters of the FP1 device.

The other buttons of the screen 900 navigate similarly. For example, the FP2 button 905 navigates to the parameter page for the FP2 device which may be, for example, another power supply board that is installed in the power management system. Buttons 906, 907, 908 and 909 navigate to their corresponding one of four NAC power control boards connected to the system. Button 910 navigates to the parameter page for the MCU 509 of the data manager and interface logic 409.

Figure 10:
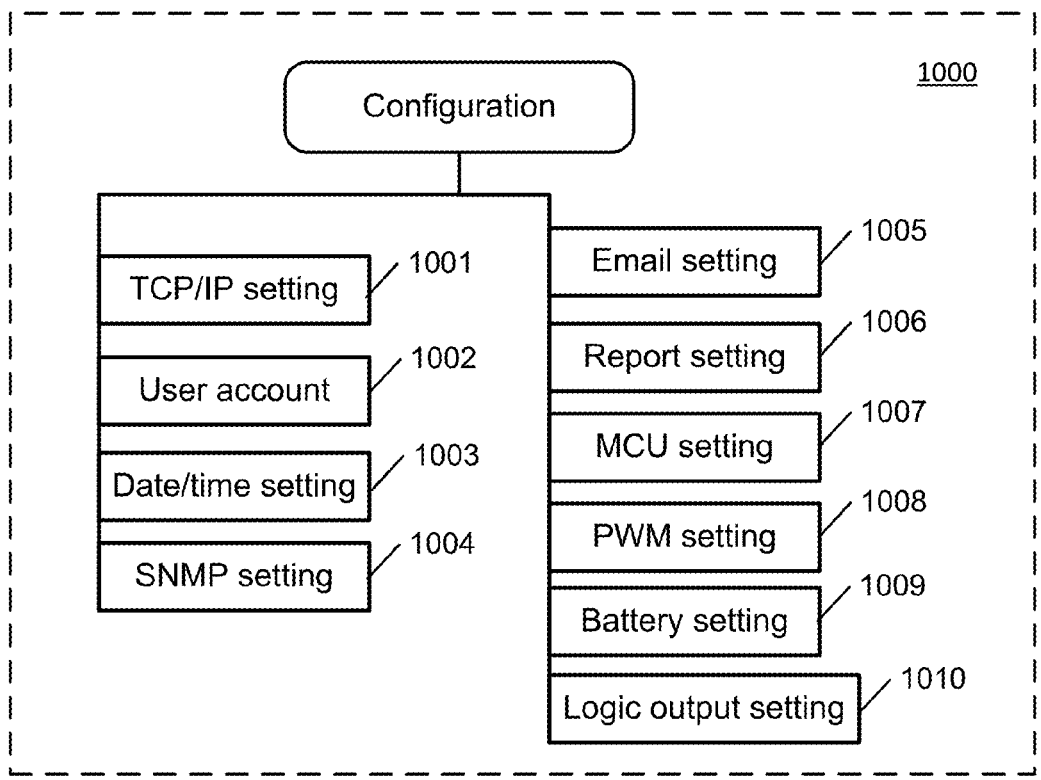
FIG. 10 is a diagram of a navigable configuration page of the GUI in accordance with an embodiment.

Selection of button 902 "configuration" navigates to the configuration page 1000 which is illustrated in FIG. 10. The configuration page 1000 provides another set of selectable buttons such as TCP/IP setting button 1001. Selection of TCP/IP setting button 1001 navigates to a TCP/IP settings page which allows entry of an IP address, subnet mask, gateway address, etc., so the power management system can be accessed by, for example, remote device 319 over intranet/Internet 369. This parameter may be set by a system administrator.

Button 1002 navigates to a user account setting page. The system administrator may use the user account setting page to setup user accounts for remote users having "read only" operation access. Only a system administrator can perform write operations in accordance with the exemplary embodiment. Button 1003 navigates to a date/time setting page that allows the system administrator to set the system date and time. The system administrator may select SNMP setting button 1004 to access an SNMP setting page to setup SNMP parameters, such as SNMP user account, password and trap address, etc.

Figure 11:
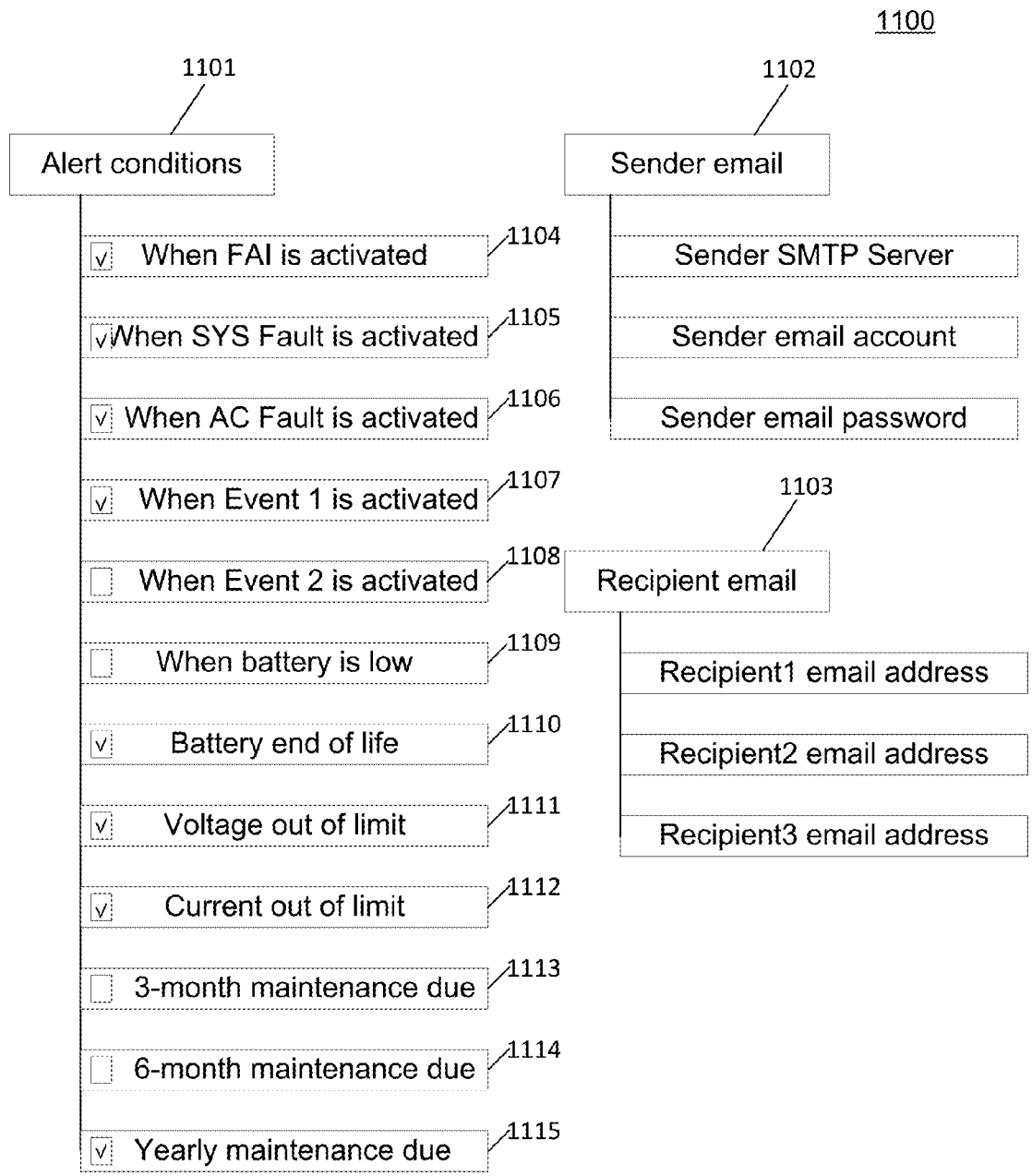
FIG. 11 is a diagram of an email setting page of the GUI in accordance with an embodiment.

Selecting the email setting button 1005 navigates to an email setting page 1100 shown in FIG. 11 where the system administrator can setup email alert trigger conditions 1101, email sender parameters 1102 including server name, email address and password, and recipients' email addresses 1103. If any of the email alert trigger conditions are met, emails with a parameter report as an attachment will be sent to the specified email recipients. When the trigger condition is removed (such as when a fault is cleared), the system will also send out email to notify the change of status.

Figure 12:
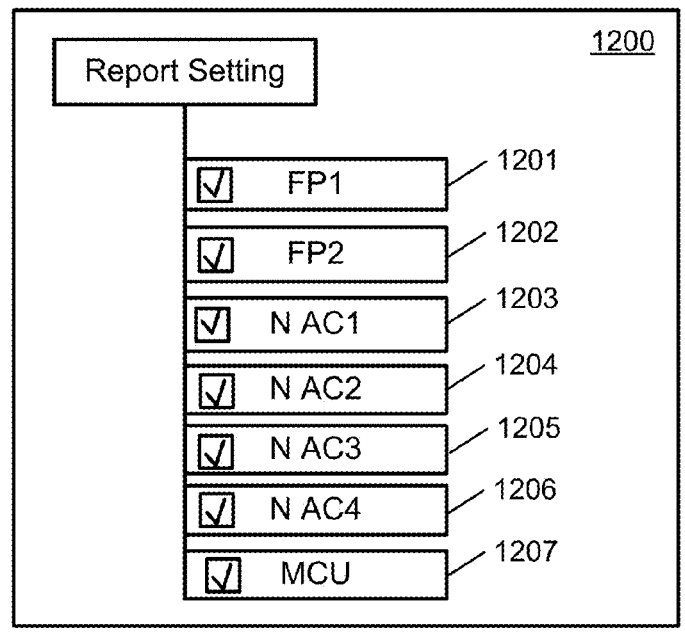
FIG. 12 is a diagram of a report setting page of the GUI in accordance with an embodiment.

The report setting button 1006 navigates to a report setting page 1200 which will be described with respect to FIG. 12. The report setting page 1200 allows the administrator to select the contents to be included in the parameter report attached to the email. MCU setting button 1007 navigates to an MCU settings page where the system administrator can assign installation specific names to the signals sensed by the MCU 509. The PWM setting button 1008 navigates to a page where the system administrator may setup the parameters of the two PWM channels on the data manager and interface logic 409. Battery setting button 1009 navigates to a page where the system administrator can setup battery diagnostic parameters. Logic output setting button 1010 navigates to a page that allows the system administrator to set the logic outputs on the data manager and interface logic 409 to a high or low level.

FIG. 11 provides an example of the email setting page 1100 which is accessed by selecting the email setting button 1005 on page 1000 shown in FIG. 10. A list of alert conditions 1101 is displayed which allows the system administrator to select, for example by checking or un-checking a checkbox next to each alert condition. For example, if the checkbox for 1104 "When FAI is activated" is checked, an email alert will be sent out if the control and access logic 405 received a Fire Alarm Interface (FAI) signal 329 from the Fire Alarm Control Panel (FACP) over the FAI interface 331. Similarly, if the checkbox for "When SYS Fault is activated" 1105 is checked, an email alert will be sent out when a System Fault occurs. If the checkbox for "When AC Fault is activated" 1106 is checked, an alert email will be sent out when an AC Fault is detected. The two input signals from external events connected to the power management system may be selected for alerts by checking the checkboxes for 1107 and 1108. If the 1107 or 1108 checkboxes are checked, then an alert email will be sent out when the related event is activated.

The "When battery is low" 1109 alert condition is obtained by the Device Data Handler module 531 of the data manager and interface logic 409. The Device Data Handler module 531 uses battery capacity, battery voltage and battery current-time integration to derive the "battery low" condition. For example, in one embodiment, if 1109 is selected, an email alert will be sent out when the battery 335 is discharged down to 20% capacity. Likewise in accordance with the embodiments the "Battery end of life" 1110 alert condition is derived by the Device Data Handler module 531 based on the user entered "battery life (years)" and recorded battery "hours of operation." If the "Battery end of life" 1110 condition is checked, an alert email will be sent out when the battery reaches the specified life entered in the battery setting page.

If the "Voltage out of limit" 1111 alert condition is selected, an alert email will be sent out when any one of the three ADC channel (of interfaces 343) readings exceeds a programmed upper or lower limit. If the "Current out of limit" 1112 alert condition is checked, an alert email will be sent out when any one of the three Hall current sensor (of interfaces 343) readings exceeds programmed upper or lower limit. If the "3-month maintenance due" 1113 alert condition is checked, an alert email will be sent out when 3 months has elapsed since last maintenance warning. If the "6-month maintenance due" 1114 alert condition is checked, an alert email will be sent out when 6 months has elapsed since last 6-month maintenance. If the "Yearly maintenance due" 1115 alert condition is selected, an alert email will be sent out when one year has elapsed since last yearly maintenance.

Various other email alert trigger conditions may be set in accordance with the embodiments. For example, the interfaces 343 shown in FIG. 5 may be used to designate various email alert trigger conditions. For example, any voltage sensed by the ADC inputs of interfaces 343, or a current sensed by Hall-effect sensors of interfaces 343 may be utilized. Maintenance reminder emails may also be programmed to go out at different length of intervals (in accordance to relevant safety regulations for the specific application). Additionally, periodic email with report attachment may also be sent during normal operating condition, in accordance with the embodiments. The period of the regular email report may be programmed by the system administrator.

As mentioned briefly above, selecting the report setting button 1006 on page 1000 as shown in FIG. 10 navigates to a report setting page. The report setting page 1200 is shown in FIG. 12. The report setting page 1200 allows the system administrator to select the parameters for each device (and the MCU 509 parameters) to be included in the report file. Table 4 provides an example list of the devices for which a parameter report can be configured in accordance with the embodiments.

TABLE 4

Configurable Device Reports Provided By The "Report setting" Page

| Device name | Device Description | Notes |
| --- | --- | --- |
| FP1 | Power supply board (#1) | |
| FP2 | Power supply board (#2) | |
| NAC1 | NAC power control board (#1) | |
| NAC2 | NAC power control board (#2) | |
| NAC3 | NAC power control board (#3) | |
| NAC4 | NAC power control board (#4) | |
| MCU | Data Manager and Interface Logic MCU | For variables sensed by the MCU. |

Figure 13:
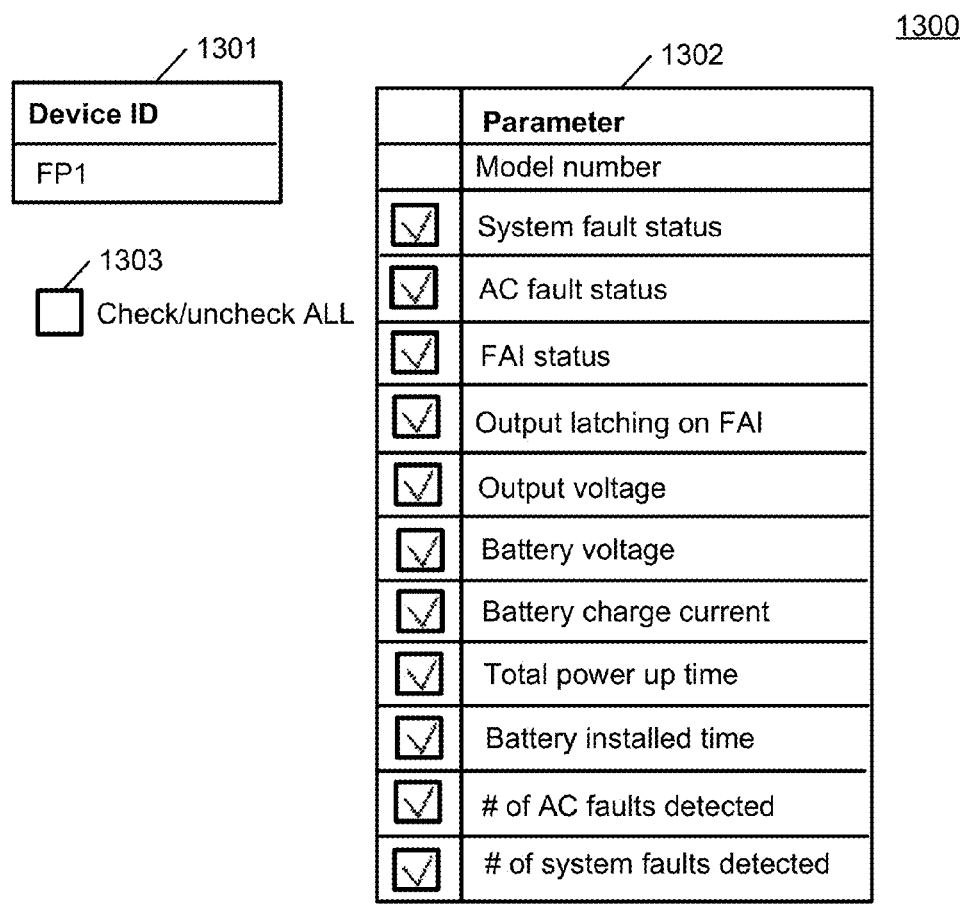
FIG. 13 is a diagram of a power supply/charger (FP1) report setting page of the GUI in accordance with an embodiment.

In addition to the capability of selecting a device on report setting page 1200, the specific parameters of the device to be sent in the report email are also configurable in accordance with the embodiments. For example, on the report setting page 1200, a device may be selected, for example FP1 1201. Selecting the FP1 1201 button navigates to an FP1 parameter setting page 1300 shown in FIG. 13. The report setting page for device FP1 1300 displays information such as the device ID 1301 and a list of device FP1 parameters 1302. A selectable checkbox may be provided for each parameter as shown in FIG. 13. That is, to include a parameter into the report, the system administrator can check the corresponding checkbox for the desired parameter. Otherwise, the system administration can uncheck the checkbox to omit the parameter from the report. Checkbox 1303 toggles between checking all parameters in the list 1302 and un-checking all parameters in the list 1302.

FIG. 14 illustrates an example of an MCU parameter report setting page 1400. The MCU report setting page 1400 is arrived at by selecting the MCU button 1207 in the report setting page 1200 shown in FIG. 12. The MCU report setting page 1400 provides a site ID 1401 that is entered by the system administrator to identify the site where the power management system is installed. A list of the MCU parameters 1402 is provided with a checkbox for each parameter. Similar to the report setting page previously discussed, a parameter may be included into, or omitted from, the report by checking, or un-checking, the desired parameter's corresponding checkbox, respectively. A "check all/un-check all" toggle checkbox 1403 is also provided.

Figures 15, 16:
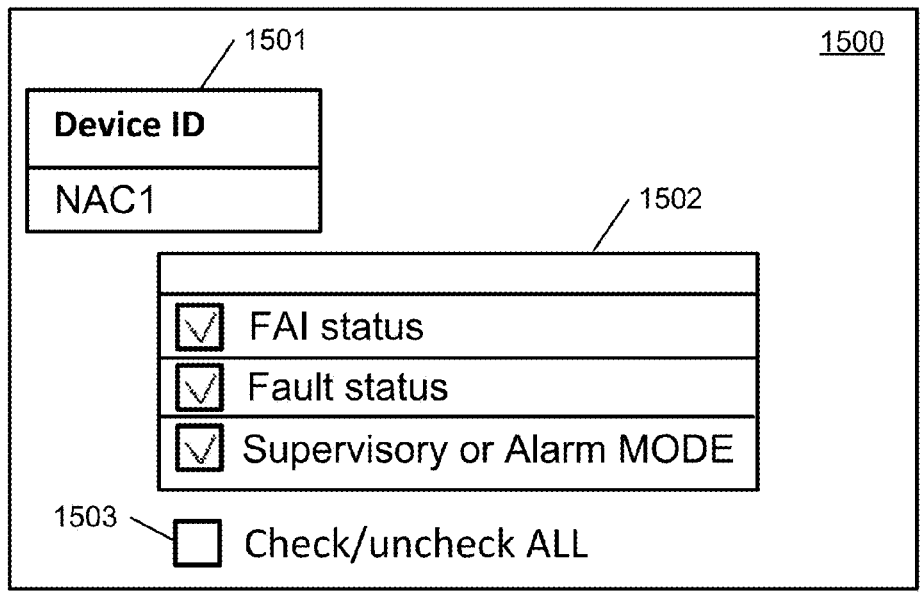
FIG. 15 is a diagram of a NAC device report setting page of the GUI in accordance with an embodiment.
FIG. 16 is a diagram of an MCU setting page of the GUI in accordance with an embodiment.

FIG. 15 provides an example parameter report setting page 1500 for device NAC1. The device ID 1501 is shown along with a list of NAC1 parameters 1502. Operation of the report setting page 1500 is similar to those already described, that is, there is a checkbox for each parameter. To include a parameter into the report, the system administrator can check the check box next to the desired parameter. Otherwise, the system administrator can uncheck the check box. A "check all/un-check all" toggle checkbox 1503 is also provided.

FIG. 16 provides an example of an MCU setting page 1600 which is navigated to by selecting the MCU setting button 1007 in the configuration menu of configuration page 1000. The MCU setting page 1600 provides a list of MCU variables 1621 handled by the MCU and an assigned name column 1622 that allows entry of an assigned name for each variable. The assigned names may be entered when the power management system is installed in a job site. The system administrator can enter a site ID to identify the installation location. Exemplary variable names are shown in the assigned name column 1622 and the names provide examples of events or devices that may be monitored.

FIG. 17 provides an example of a "PWM setting" page 1700 and a "Logic output setting" page 1701. The PWM setting page 1700 is navigated to by selecting the PWM setting button 1008 on configuration page 1000, while the Logic output setting page 1701 is navigated to by selecting the logic output setting button 1010 on the configuration page 1000. The PWN setting page 1700 displays a PWM output channel number column 1751 and a frequency column 1752 that allows the system administrator to set the frequency through a pull-down list. For example, the pull-down list may provide multiple frequency choices ranging from 120 Hz to 20 kHz (based on an MCU internal PWM specification). A duty cycle column 1753 allows the system administrator to set the duty cycle. For example, a duty cycle range from 0% to 100% may be set where 0% sets the output to constant low level and 100% sets the output to constant high level.

The Logic output setting page 1701 displays a logic output channel column 1754 which shows the logic output channels. A set value column 1755 shows the logic output value, and the system administrator can select a "high" or "low" level through a pull-down menu as shown in FIG. 17.

FIG. 18 provides an example of a Battery setting page 1800 which is navigated to by selecting the battery setting button 1009 on the configuration page 1000. The battery setting page 1800 provides a column 1871 that allows the system administrator to select whether to activate a warning signal identified in a warning type column 1872. Column 1873 shows the battery parameters used to derive the warning signals. Column 1874 allows the system administrator to enter the battery parameters and column 1875 indicates the unit of the corresponding parameter value.

Figure 19:
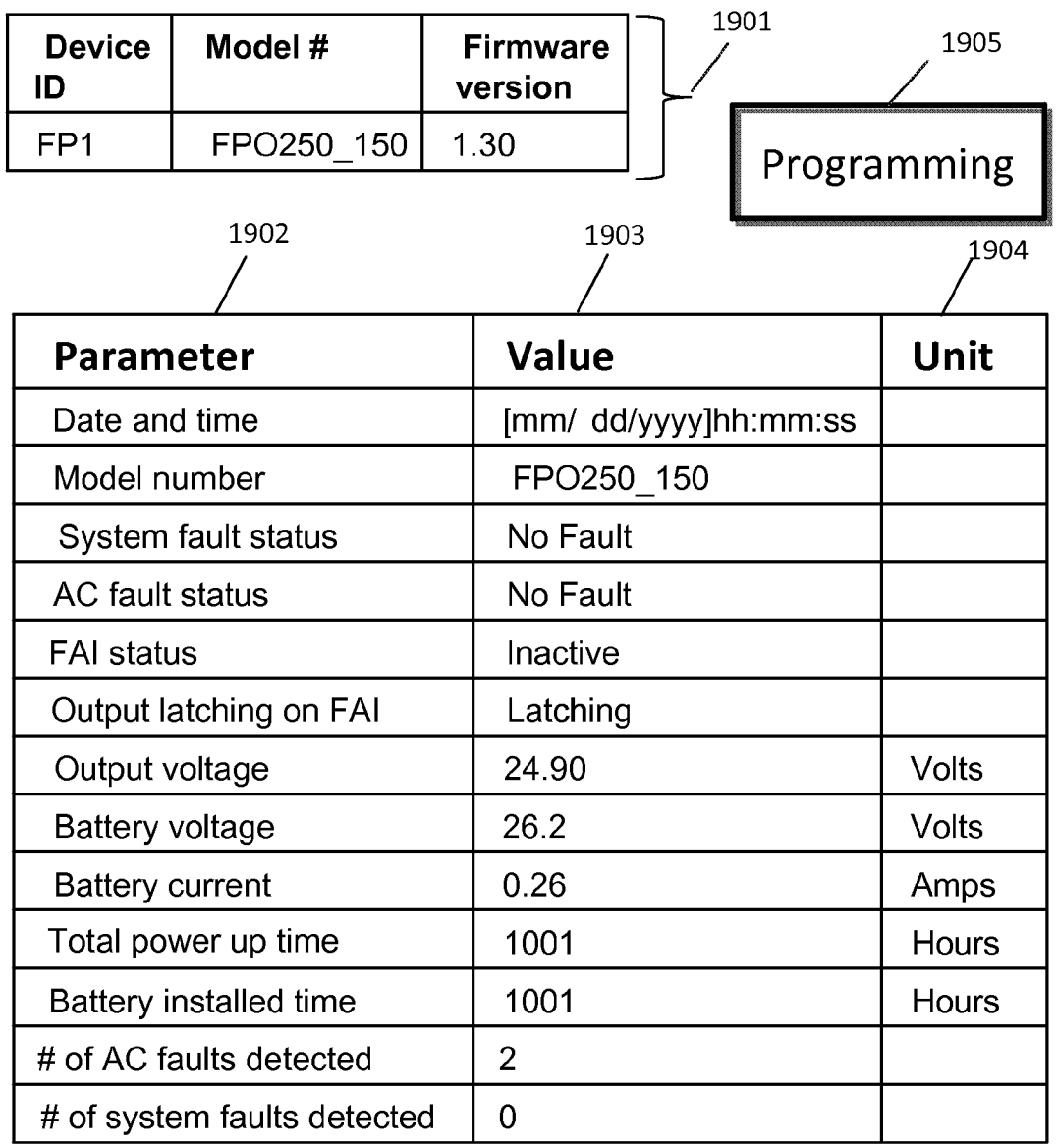
FIG. 19 is a diagram of a power supply/charger (FP1) real time parameters page of the GUI in accordance with an embodiment.
Figure 20:
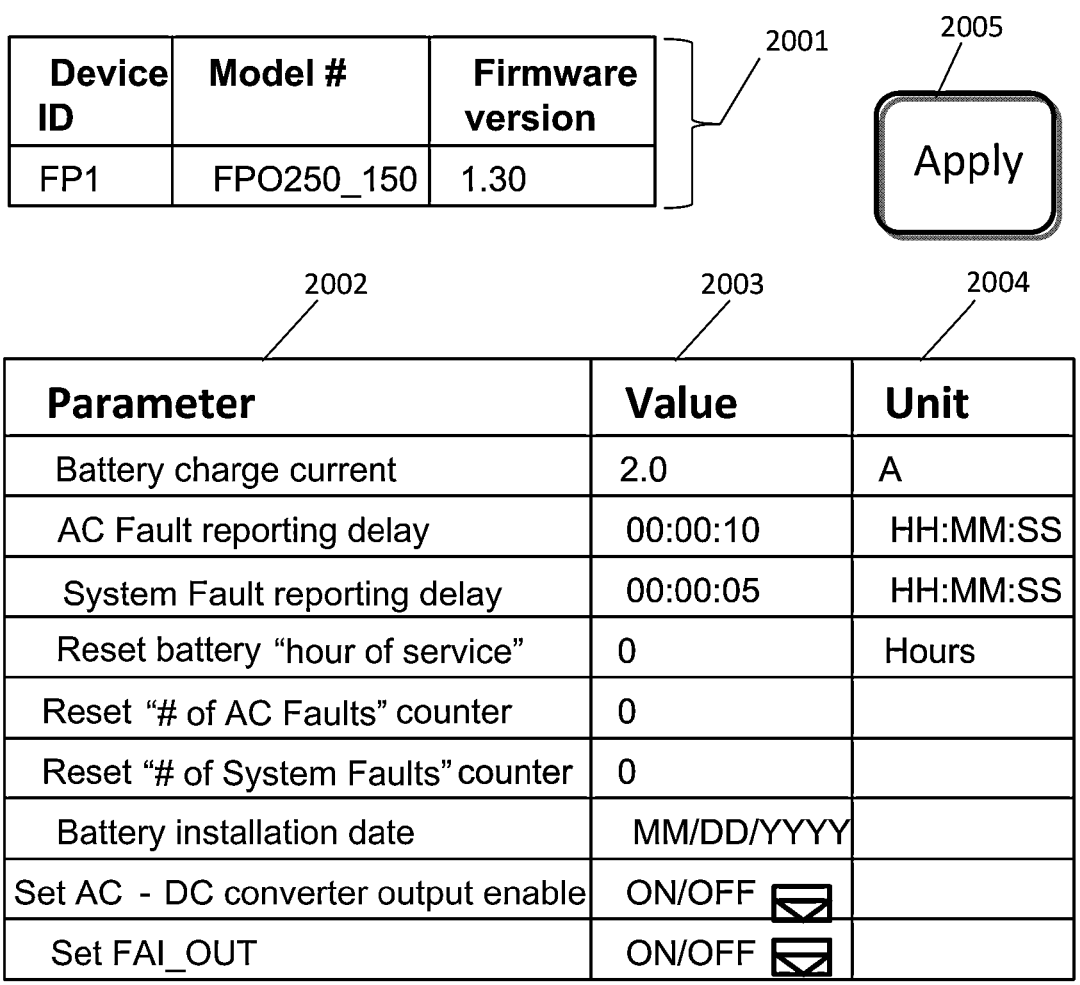
FIG. 20 is a diagram of a power supply/charger (FP1) programming page of the GUI in accordance with an embodiment.

FIG. 19 provides an example of an FP1 real time parameters page 1900. The FP1 real time parameters page 1900 is navigated to by selecting the FP1 button 904 on the initial page 900 shown in FIG. 9. A header block 1901 is displayed that provides the device ID, model number and firmware revision information. Also displayed on page 1900 is a parameter name column 1902, a current value column 1903, and a units column 1904. A programming button 1905 navigates to a programming page 2000 illustrated in FIG. 20.

The FP1 parameter programming page 2000 includes a header block 2001, and a column of programmable parameters 2002. The system administrator can enter values of the programmable parameters in value column 2003. A units column 2004 shows the units for the parameters. Selection of the "Apply" button 2005 causes the programmed parameters to be written into a microcontroller on the FP1 device. If the FP1 device is the main power supply/charger board 301 of the embodiments, the parameters will be written to the control and access logic 405.

Figure 21:
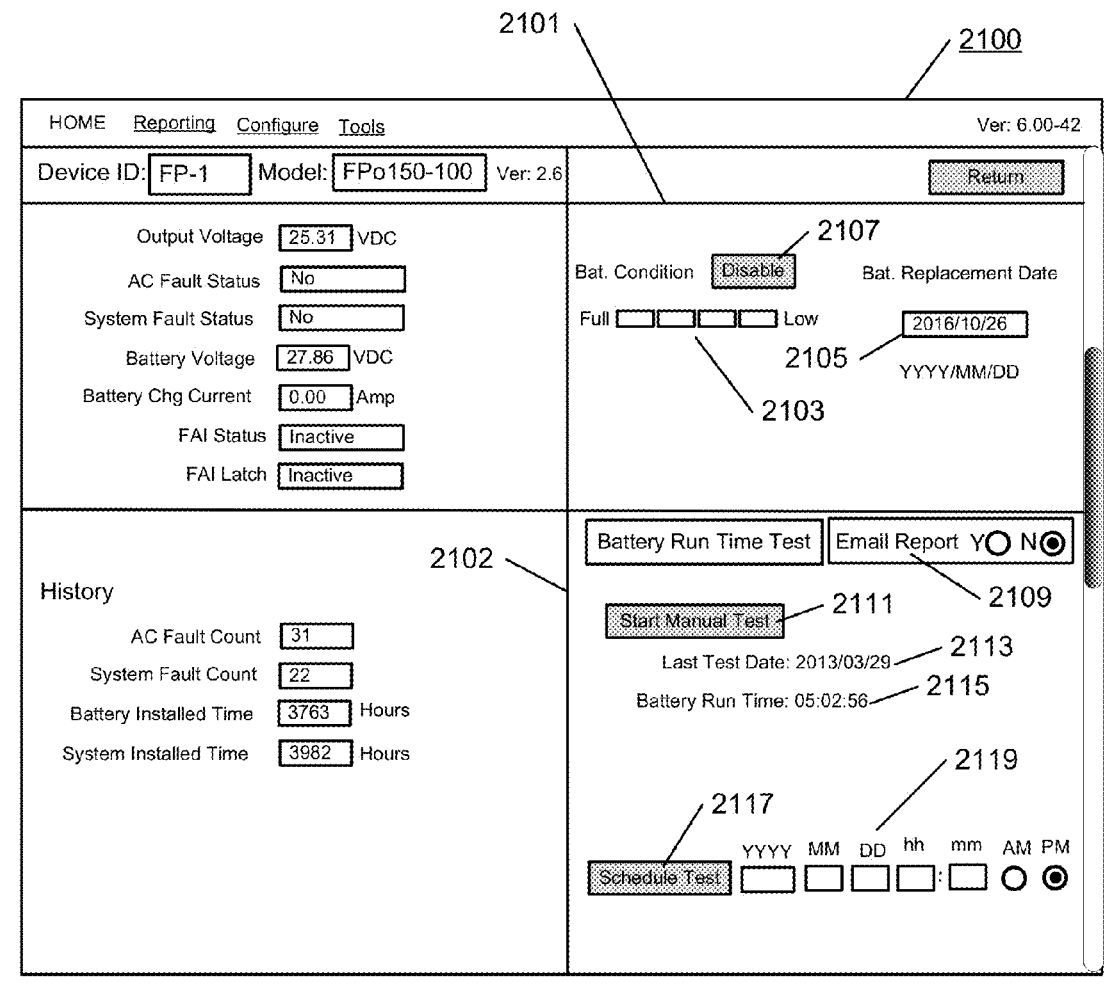

FIG. 21 provides an example of a power supply/charger board data page 2100 of the GUI 323 in accordance with one embodiment. The example power supply/charger board data page 2100 is best understood with respect to FIG. 4B and the flowchart for a remote battery test method of operation 2200 shown in FIG. 22. The example power supply/charger board data page 2100 includes a battery status pane 2101 that has the soft battery meter 2103 that indicate the battery SoC (State of Charge). A user entered battery replacement date 2105 may also be displayed in the battery status pane 2101. If this date is reached, an email may be sent out to alert the user to replace the battery. A selectable "Disable" button 2107 allows a user to disable current measurement by the data manager and interface logic 409 by, for example, disabling the current measurements from the current sensors 475A or 475B over the respective interfaces 343A or 343B.

As discussed above briefly with respect to FIG. 4B, a user may initiate a remote battery discharge test from battery test pane 2102 via a "one-click" operation, by actuating selectable "Start Manual Test" button 2111 by a single cursor or mouse click. The battery test pane 2102 includes scheduling input fields 2119 that allow a user to schedule an automatic battery discharge test in the future. After entering date and time information into the scheduling input fields 2119, the user may actuate selectable "Schedule Test" button 2117 to save the inputs which stores the inputs in memory and schedules the test. The battery discharge test will then be run automatically at the specified time and date. The user may also use email selection field 2109 to select whether to send alert emails when the battery SoC is below a certain level. For example, the user may receive an email for an alert threshold when the SoC is 20%. When a remote battery discharge test is completed, the result of the test may be displayed in the battery test pane 2102 in a "Last Test Date" field 2113 and a "Battery Run Time" field 2115 as shown in FIG. 21.

Figure 22:
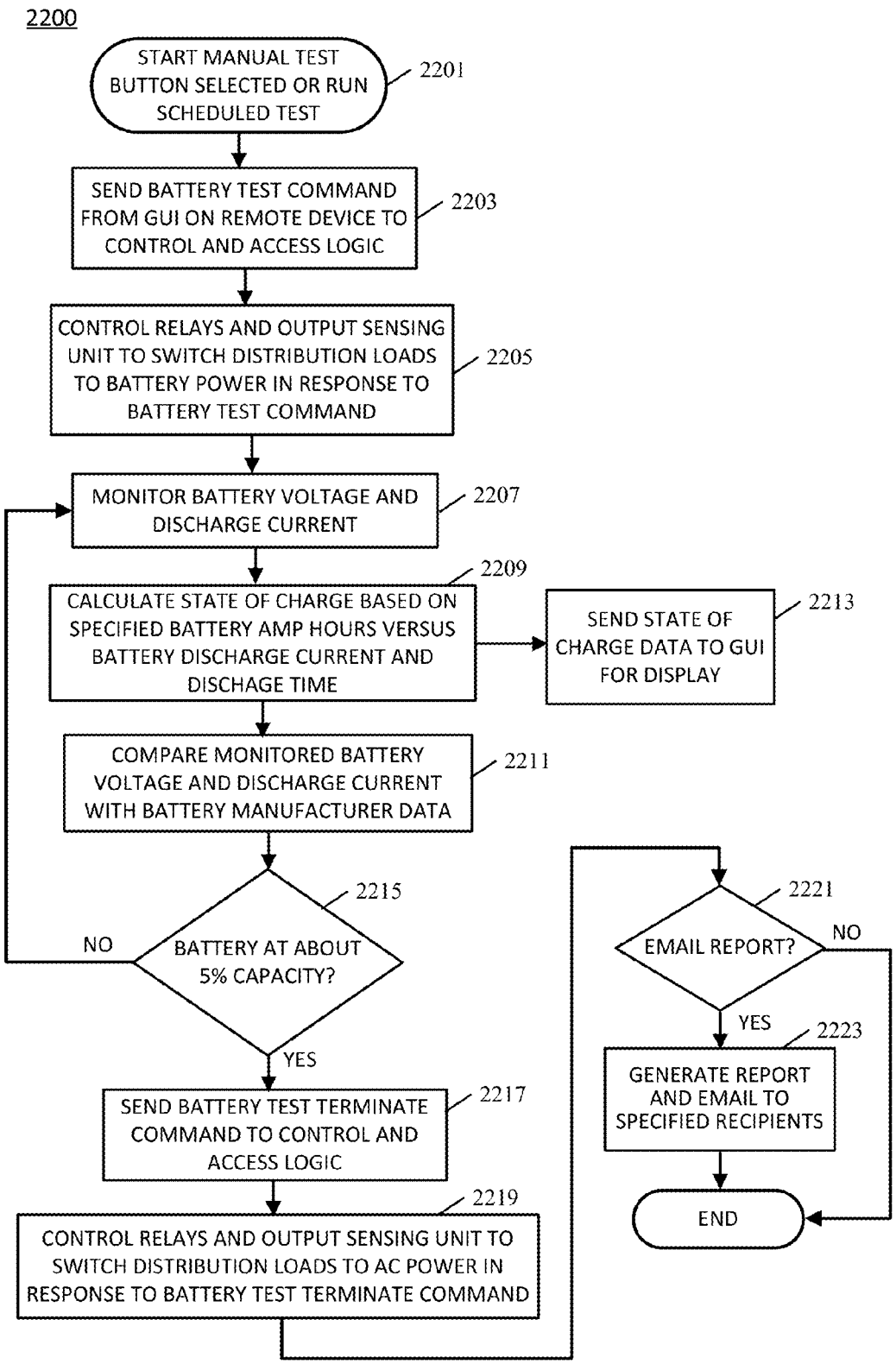
FIG. 22 is a flowchart showing a remote battery testing method of operation in accordance with some embodiments.

Turning to the flowchart of FIG. 22 in conjunction with FIG. 4B and FIG. 21, a remote battery test method of operation 2200 begins at operation 2201 when the user either actuates selectable "Start Manual Test" button 2111, or when a scheduled test is run based on date and time information previously entered into the scheduling input fields 2119. In operation block 2203, the GUI 323 sends a battery test command from the remote device 319 to the control and access logic for the battery under test. Thus, for example, if the battery to be tested is battery 335B, the data manager and interface logic 409 receives the battery test command over the network 313 and forwards the command to the control and access logic 405B. As described above with respect to FIG. 4B, and as shown in operation block 2205, the control and access logic 405B will respond to the command and will control the corresponding relays and output sensing 347 to switch the distribution load 473B from AC power to battery power from the battery 335B.

In operation block 2207, the battery 335B voltage and discharge current may then be monitored by the control and access logic 405B, or may be monitored by both the control and access logic 405B and the data manager and interface logic 409 concurrently. In some embodiments, the data manager and interface logic 409 will perform the operation of operation block 2209 and will calculate the battery 335B SoC based on battery amp-hours versus battery discharge current and discharge time, and will send the SoC data to the GUI 323 as shown in operation block 2213. Alternatively, in some embodiments, this function is performed by the control and access logic 405B and the SoC data is sent to the data manager and interface logic 409 which proceeds to send the SoC data to the remote device 119 (and therefore to the GUI 323) over the network 313. In other alternative embodiments, the control and access logic 405B, the data manager and interface logic 409, or both, send only the raw voltage and discharge current measurement data to the remote device 321. In this example embodiment, the remote device 321 calculates the battery 335B SoC for display on the GUI 323.

In operation block 2211, the battery 335B voltage and discharge current are compared with battery manufacturer data that was entered into the GUI 323 and stored in memory, either at the remote device 319, memory 407B of the control and access logic 405B, or in memory 503 of the data manager and interface logic 409. That is, any of the entities such as the remote device 319, the control and access logic 405B or the data manager and interface logic 409 may perform the comparison of operation block 2211. If the entity performing the comparison determines in decision block 2215 that the battery is at about 5% capacity, the battery test procedures begins to terminate. If not, the battery voltage and discharge current continue to be monitored in operation block 2207.

If the remote battery discharge test should be terminated based on the decision in decision block 2215, and the comparison operation of block 2211 is performed by the remote device or the data manager and interface logic 409, the appropriate entity may send a battery test terminate command to the control and access logic 405B in operation block 2217. The control and access logic 405B will then respond to the battery test terminate command in operation block 2219 and will control the corresponding relays and output sensing 347 to switch the distribution load 473B from the battery 335B back to the power supply/charger board 301B output from the isolated AC-DC converter 345 (i.e. the power supply) as shown in the example of FIG. 4A.

If the GUI 323 has an email report set in decision block 2221 where the user selected "Y" (i.e. "yes") using the email selection field 2109, a report may be emailed to designated recipients as shown in operation block 2223 and the remote battery test method of operation 2200 ends as shown in FIG. 22. Otherwise, if the user selected "N" (i.e. "no") using the email selection field 2109, the remote battery test method of operation 2200 ends immediately as shown.

Therefore, among other advantages, remote battery test method of operation 2200 reduces the cost and time required for battery testing procedures because maintenance staff need not be present on the site where the battery to be tested is located. A further advantage is that the maintenance staff does not need to monitor the remote battery test because, in accordance with the embodiments, the remote battery test method of operation 2200 is automatic and termination is automatic since it is controlled based on detected conditions. Put another way, the GUI 323 and the power supply/charger board data page 2100 described above provide for a "one click" remote battery discharge test where a user actuates a "Start Manual Test" button 2111, (i.e. clicks a mouse cursor or otherwise selects the button) to initiate the remote battery test and takes no further action. The remote battery test, in accordance with the embodiments, is performed and terminated automatically without any further user intervention.

It is to be understood that the GUI 323 pages described above and illustrated in FIG. 9 through FIG. 21 are exemplary only and that other various configurations, that is, various layouts of the pages is possible and such varying configurations and/or layouts would remain within the scope of, and in accordance with, the embodiments herein disclosed.

The present disclosure further provides a computer readable memory, that includes executable instructions for execution by at least one processor, that when executed cause the at least one processor to perform the various operations described above with respect to the control and access logic 405, 405A and 405B. The present disclosure further provides a computer readable memory, that includes executable instructions for execution by at least one processor, that when executed cause the at least one processor to perform the various operations described above with respect to the data manager and interface logic. The computer readable memory executable instructions, when executed may further cause the one or more processors to send the various pages related to GUI 323 to a remote device.

A computer readable memory may store the various software/firmware described above and may be any suitable non-volatile memory such as, but not limited to programmable chips such as EEPROMS, flash ROM (thumb drives), compact discs (CDs) digital video disks (DVDs), etc., that may be used to load executable instructions or program code to devices such as, but not limited to, those described in further detail herein.

While various embodiments have been illustrated and described, it is to be understood that the invention is not so limited. Numerous modifications, changes, variations, substitutions and equivalents will occur to those skilled in the art without departing from the scope of the present invention as defined by the appended claims.

What is claimed is:

1. A method of operating a power management system, comprising:
receiving a battery test command by control and access logic positioned on a power supply and battery charger board, the battery test command from a user interface on a remote device;
controlling, by the control and access logic, a switching unit located on the power supply and charger board to switch an external load from an alternating current to direct current (AC-to-DC) power supply on the power supply and charger board to battery backup in response to the battery test command to initiate a battery discharge test;
monitoring, by the control and access logic, voltage and discharge current of the battery;
determining, by the control and access logic, that the battery has reached a threshold capacity due to battery discharge;
terminating the battery discharge test by the control and access logic in response to determining that the battery has reached the threshold capacity; and
switching, by the control and access logic, the external load back to the AC-to-DC power supply and off of the battery backup.

2. The method of claim 1, further comprising:
receiving a one-click selection input at a user interface on the remote device; and
sending the battery test command to the control and access logic in response to the one-click selection input.

3. The method of claim 2, further comprising:
comparing the monitored voltage and discharge current of the battery with battery specification data; and
determining that the battery has reached the threshold capacity based on the comparison.

4. The method of claim 1, where receiving the battery test command by the control and access logic from the user interface on the remote device, comprises:
receiving the battery test command by the control and access over a network connection.

5. The method of claim 4, where controlling a switching unit to switch the external load from the AC-to-DC power supply to the battery backup in response to the battery test command, comprises:
controlling at least one relay of the switching unit by the control and access logic to switch the external load from the AC-to-DC power supply to the battery backup in response to the battery test command.

6. The method of claim 5, further comprising:
receiving the battery test command from data manager and interface logic over the network;
forwarding the battery test command to the control and access logic on the power supply and battery charger board; and
providing measurement data to the remote device by the data manager and interface logic, the measurement data comprising voltage and discharge current of the battery measured by the control and access logic and by the data manager and interface logic.

7. The method of claim 6, further comprising:
generating and emailing a battery test report conforming to a plurality of configurable report settings in response to termination of the battery discharge test.

8. An apparatus comprising:
a power supply and battery charger board comprising:
alternating current to direct current (AC-to-DC) power supply;
a battery charger, operatively coupled to the AC-to-DC power supply;
a switching unit, operatively coupled to the AC-to-DC power supply and to the battery charger, and having outputs for connecting DC power to an external load; and
control and access logic, operatively coupled to the battery charger and to the switching unit, wherein the control and access logic is operative to:
receive a battery test command from a user interface on a remote device;
control the switching unit to switch an external load from the AC-to-DC power supply to battery backup to initiate a battery discharge test in response to the battery test command;
monitor voltage and discharge current of the battery;
determine that the battery has reached a threshold capacity due to battery discharge;

terminate the battery discharge test in response to determining that the battery has reached the threshold capacity; and
switch the external load back to the AC-to-DC power supply and off of the battery backup.

9. The apparatus of claim 8, comprising:
data manager and interface logic, operatively coupled to the control and access logic, the data manager and interface logic comprising a plurality of interface ports including at least one network interface port, the data manager and interface logic being operative to:
receive a one-click selection input from the user interface on the remote device over the network interface port; and
send the battery test command to the control and access logic in response to the one-click selection input.

10. The apparatus of claim 9, where at least one of the control and access logic or the data manager and interface logic is operative to:
compare the monitored voltage and discharge current of the battery with battery specification data; and
determine that the battery has reached the threshold capacity based on the comparison.

11. The apparatus of claim 9, where the control and access logic is operative to control the switching unit to switch the external load from the AC-to-DC power supply to the battery backup in response to the battery test command, by controlling at least one relay of the switching unit to switch the power supply to the battery backup in response to the battery test command.

12. The apparatus of claim 9, where the data manager and interface logic is operative to:
generate the battery test command based on the one-click selection input and send the battery test command to the control and access logic; and
provide measurement data to the remote device, the measurement data comprising voltage and discharge current of the battery measured by the control and access logic and by the data manager and interface logic.

13. The apparatus of claim 9, where the data manager and interface logic is operative to:
generate and email a battery test report conforming to a plurality of configurable report settings in response to termination of the battery discharge test.

14. A computer readable memory comprising:
executable instructions for execution by at least one processor, that when executed cause a first processor to:
receive a battery test command from a user interface on a remote device;
control a switching unit on a power supply and battery charger board to switch an external load from an alternating current to direct current (AC-to-DC) power supply located on the power supply and battery charger board to battery backup in response to the battery test command to initiate a battery discharge test;
monitor voltage and discharge current of the battery;
determine that the battery has reached a threshold capacity due to battery discharge;
terminate the battery discharge test in response to determining that the battery has reached the threshold capacity; and
switch the external load back to the AC-to-DC power supply and off of the battery backup.

15. The computer readable memory of claim 14, wherein said executable instructions, when executed further cause a second processor to:
receive a one-click selection input at a user interface on the remote device; and
send the battery test command in response to the one-click selection input.

16. The computer readable memory of claim 15, wherein said executable instructions, when executed further cause the second processor to:
receive the battery test command over a network;
forward the battery test command to the first processor located on the power supply and battery charger board; and
provide, by the second processor, measurement data to the remote device, the measurement data comprising voltage and discharge current of the battery measured by the first processor and by the second processor.

17. The computer readable memory of claim 15, wherein said executable instructions, when executed further cause the second processor to:
generate and email a battery test report conforming to a plurality of configurable report settings in response to termination of the battery discharge test.

18. The computer readable memory of claim 14, wherein said executable instructions, when executed further cause the first processor to:
compare the monitored voltage and discharge current of the battery with battery specification data; and
determine that the battery has reached the threshold capacity based on the comparison.

19. The computer readable memory of claim 14, wherein said executable instructions, when executed further cause the first processor to receive a battery test command from a user interface on a remote device, by:
receiving the battery test command over a network connection.

20. The computer readable memory of claim 14, wherein said executable instructions, when executed further cause the first processor to switch the external load from the AC-to-DC power supply to the battery backup in response to the battery test command, by:
controlling at least one relay of the switching unit to switch the external load from the AC-to-DC power supply to the battery backup in response to the battery test command.

* * * * *